United States Patent
Nose et al.

(10) Patent No.: US 7,821,249 B2
(45) Date of Patent: Oct. 26, 2010

(54) PHASE DIFFERENCE MEASURING DEVICE AND PHASE COMPARISON CIRCUIT ADJUSTING METHOD

(75) Inventors: Koichi Nose, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 339 days.

(21) Appl. No.: 12/088,180

(22) PCT Filed: Sep. 28, 2006

(86) PCT No.: PCT/JP2006/319355

§ 371 (c)(1),
(2), (4) Date: Mar. 26, 2008

(87) PCT Pub. No.: WO2007/037340

PCT Pub. Date: Apr. 5, 2007

(65) Prior Publication Data

US 2009/0146640 A1    Jun. 11, 2009

(30) Foreign Application Priority Data

Sep. 28, 2005    (JP)    ............... 2005-282630

(51) Int. Cl.
G01R 29/26    (2006.01)
G01R 27/04    (2006.01)
(52) U.S. Cl. .................. 324/76.77; 702/72; 324/637
(58) Field of Classification Search .............. 324/66, 324/233, 521, 617, 622, 683, 709, 76.52, 324/76.77, 555, 637; 327/141–163; 73/61.44; 375/266, 371–376; 702/76
See application file for complete search history.

(56) References Cited

FOREIGN PATENT DOCUMENTS

| JP | 05-066236 | 3/1993 |
|----|-----------|--------|
| JP | 06-098345 | 4/1994 |
| JP | 2000-111587 | 4/2000 |

OTHER PUBLICATIONS

Abskharoun et al., "Circuit for On-Chip Sub-Nanosecond Signal Capture and Characterization", IEEE Custom Integrated Circuits Conference 2001.
Weinlander et al., "An Eight Channel 36GSample/s CMOS Timing Analyzer", IEEE International Solid-State Circuits Conference 2000.
Mota et al., "A High-Resolution Time Interpolator Based on a Delay Locked Loop and an RC Delay Line", IEEE Journal of Solid-State Circuits, vol. 34, No. 10, Oct. 1999.

Primary Examiner—Timothy J Dole
Assistant Examiner—Farhana Hoque
(74) Attorney, Agent, or Firm—Sughrue Mion, PLLC

(57) ABSTRACT

A phase difference measuring device according to this invention has an object of shortening the measuring time, and includes a plurality of phase difference measuring circuits (104, 105, 106) formed in a row, and phase difference conversion circuits (101, 102, 103) each connected between adjacent phase difference measuring circuits. The phase difference measuring circuit receives first and second signals, respectively gives the first and second signals first and second delay amounts cumulatively a plurality of number of times, and, whenever giving the delay amounts, compares the phases of the first and second signals given the delay amounts, thereby determining which one of the phases leads the other. The phase difference conversion circuit receives the first and second signals input to the phase difference measuring circuit in the preceding stage, respectively gives the first and second signals a first total delay amount (Tr1) as a total of the first delay amounts and a second total delay amount (Ts1) as a total of the second delay amounts given by the phase difference measuring circuit in the preceding stage, and outputs the first and second signals to the phase difference measuring circuit in the succeeding stage.

13 Claims, 21 Drawing Sheets

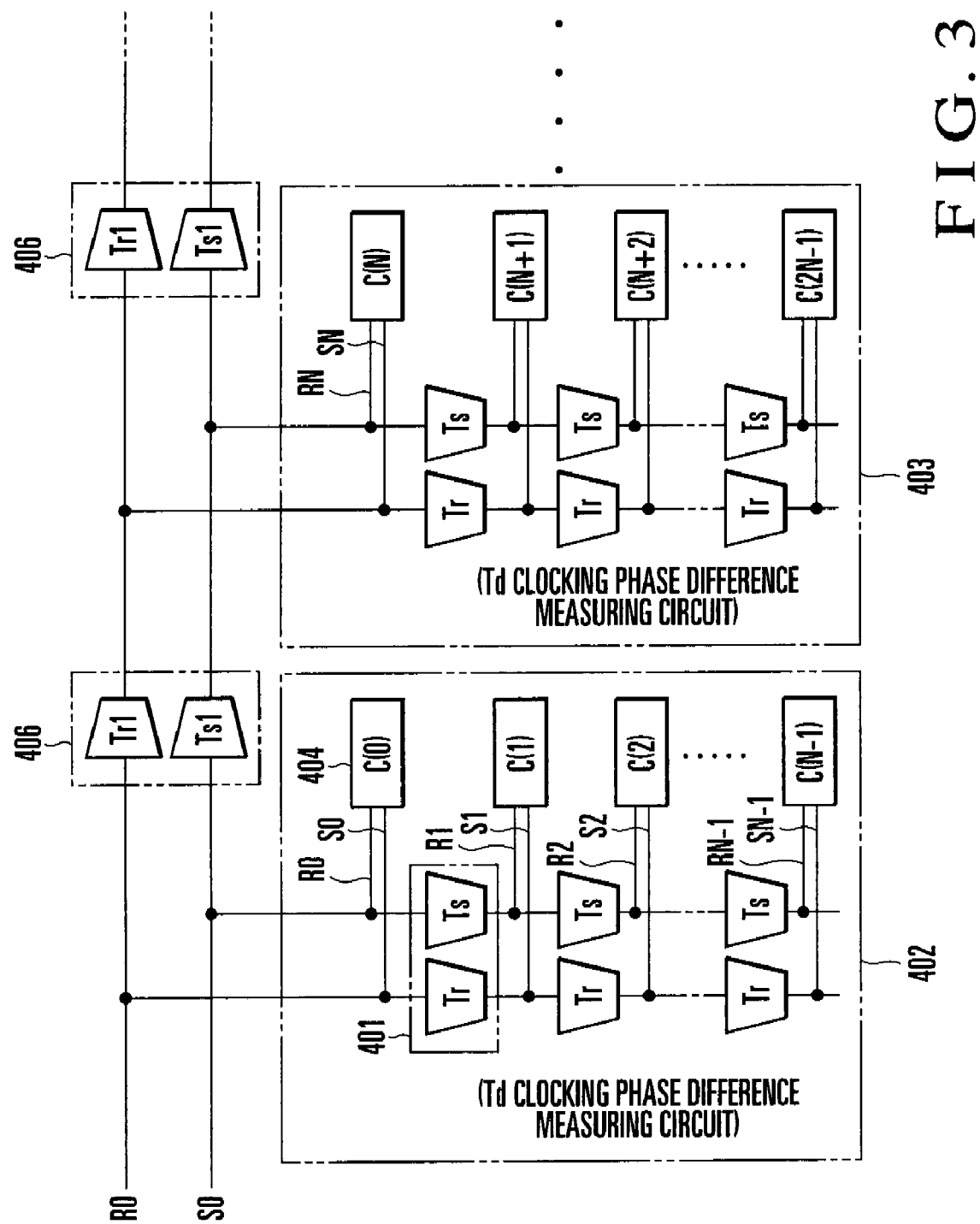

PHASE DIFFERENCE MEASURING DEVICE AND PHASE COMPARISON CIRCUIT ADJUSTING METHOD

TECHNICAL FIELD

The present invention relates to a phase difference measuring device for measuring the phase difference between two signals in an integrated circuit or the like, and a method of adjusting a phase comparison circuit in this phase difference measuring device.

BACKGROUND ART

Recently, as the speed and complexity of integrated circuits increase, a clock timing fluctuation (jitter) occurs due to noise or variations in a chip, thereby causing an operation error. Conventionally, a signal is extracted outside an integrated circuit, and the behavior of the signal is observed. However, while the operating frequency of an integrated circuit rises year by year, the operating frequency band of a board or package outside the integrated circuit does not follow this rising rate. This makes a high-speed operating clock inside an integrated circuit difficult to observe outside the integrated circuit. Also, if the clock is extracted outside the integrated circuit, a jitter occurring during the process of extracting the clock outside the integrated circuit is added to the jitter occurring inside the integrated circuit, so the internal jitter of the integrated circuit is difficult to accurately estimate. This increases the importance of a method of observing the internal operation of a chip by forming a phase difference observation circuit inside the chip.

A method that compares a clock to be measured with a reference clock and detects the phase difference as a jitter of the clock to be measured is widely known as a method of measuring a clock's jitter. In this method, the resolution of a phase difference measuring circuit that measures the phase difference between two signals determines the measurement performance.

A conventional method of measuring the phase difference between two signals is disclosed in reference 1 (Japanese Patent Laid-Open No. 2000-111587). In this method as shown in FIG. 21, the phase of a signal S0 to be measured is shifted by a plurality of delay elements 2201, and compared with the phase of a reference signal R0. If the signal S0 to be measured deviates from the reference signal R0 by time Tjit, a phase difference Tjit is input to a first phase comparator C0, and a phase difference Tjit−Ts (Ts is the delay of the delay element 2201) is input to a second phase comparator C1. The phase comparators C0, C1, . . . are circuits that output "1" when the phase difference is 0 or more, and "0" in other cases. Since the output result from a phase comparator CN for which Tjit−N×Ts is 0 or less becomes "0" for the first time, the value of N is found by observing this result. On the basis of this value, the phase difference Tjit can be measured to be approximately N×Ts.

Unfortunately, this method cannot achieve a resolution equal to or smaller than the delay Ts of the delay element 2201, and this makes high-performance jitter measurements difficult.

As a phase difference measuring device for solving this problem, a method proposed in reference 2 (Custom Integrated Circuit Conference, pp. 251, 2001) will be explained below. As shown in FIG. 22, a delay element having a delay time Ts and a delay element having a delay time Tr are used to form a phase difference conversion circuit 2301. First, the first phase difference conversion circuit 2301 shifts the phase difference between a reference signal R0 and a signal S0 to be measured by Td (=Ts−Tr), and the phase difference between S1 and R1 becomes Tjit−Td as shown in FIG. 23. Then, a second phase difference conversion circuit 2302 shifts the phase difference between R2 and S2 by Td (=Ts−Tr), and the phase difference between S2 and R2 becomes Tjit−2Td. Thus, signals are generated in each stage by shifting the phase difference between two signals by Td (=Ts−Tr). Subsequently, phase comparators C0, C1, . . . compare the phases of these outputs, and output the comparison results. The resolution of this phase difference measuring device is Td.

In this method, if a maximum jitter (a maximum value of the time difference Tjit between the reference signal R0 and the signal S0 to be measured) is m×Td (m is an integer), m phase difference conversion circuits 2301 must be cascaded to perform measurements, so a time of m×Tr is required from inputting of the two signals to outputting of the results (i.e., to arrival of the signals at the final stage). If this value increases, the number of times of measurements per unit time is limited, and the variations of the delay elements increase the error of the delay time until the signals arrive at the final stage, thereby decreasing the measurement accuracy.

A method of reducing the influence of the element variations as described above is proposed in reference 3 (IEEE International Solid-State circuits conference (ISSCC), pp. 170, 2000). This method randomly sets phase differences between input signals, and repetitively performs measurements, thereby obtaining a correlation between the output result and the input signal phase difference. If a difference from an ideal value is large, the method changes the delay of an element or the value of an offset adjusting circuit, and repetitively executes the random measurements, thereby reducing the variations.

Unfortunately, this method has the problems that, e.g., a random signal generating means is necessary, the repetitive measurements increase the measuring time, and an offset adjusting circuit changing algorithm having a high convergence is necessary.

Also, reference 4 (IEEE Journal of Solid-state circuits, pp. 1360, 1999) has proposed a method using a Delay-Locked-Loop (DLL) that reduces the influence of variations by controlling the delays of delay elements. This method has the problems that, e.g., a delay cell whose delay is controllable must be designed, the configuration must be changed if an input clock frequency changes, and the variation of each delay element cannot be controlled although the delay time of the whole phase difference measuring circuit is controllable.

Furthermore, it is difficult to adjust the offset of a flip-flop as shown in FIG. 24 used as a phase comparator. Therefore, reference 3 has also proposed a phase comparator as shown in FIG. 25 as an offset-adjustable phase comparator. However, this phase comparator requires a sync signal (clock) for driving a precharge terminal 2601 in addition to two signals (inputs 1 and 2) as objects of phase difference measurement, and the generation and distribution of the sync signal increase the complexity of design.

DISCLOSURE OF INVENTION

Problems to be Solved by the Invention

When measuring a large clock jitter, the measuring methods used in the conventional integrated circuits described above increase the signal arrival time from inputting to the final stage in proportion to the measuring range. Consequently, the measuring speed and the jitter of the measuring circuit itself limit the performance. In addition, the problem that the variations between the delay elements decrease the measurement accuracy also has a large influence on the performance.

It is, therefore, the first object of the present invention to provide an integrated circuit capable of shortening the signal arrival time from the input stage to the final stage by preparing a few types of phase difference conversion circuits having different phase differences, and hierarchically connecting these phase difference conversion circuits.

It is the second object of the present invention to provide an integrated circuit capable of adjusting the measuring range by changing the connections in the hierarchical structure described above, and reducing the influence of variations or noise of a plurality of measuring circuits on the measurement results by measuring a clock jitter by these measuring circuits at the same time.

It is the third object of the present invention to provide an offset adjusting method that requires neither a repetitive operation nor a complicated algorithm by switching the phase difference of a phase difference conversion circuit to zero, and sequentially adjusting the offsets of phase comparators.

Means for Solving the Problems

A phase difference measuring device according to the present invention is characterized by comprising a plurality of first phase difference measuring circuits formed in a row, and first phase difference conversion circuits each connected between adjacent first phase difference measuring circuits, wherein the first phase difference measuring circuit receives a first signal and a second signal, respectively gives the first signal and the second signal a first delay amount and a second delay amount cumulatively a plurality of number of times, and, whenever giving the delay amounts, compares phases of the first signal and the second signal given the delay amounts, thereby determining which one of the phases leads the other, and the first phase difference conversion circuit receives the first signal and the second signal input to the first phase difference measuring circuit in a preceding stage, respectively gives the first signal and the second signal a first total delay amount as a total of the first delay amounts and a second total delay amount as a total of the second delay amounts given by the first phase difference measuring circuit in the preceding stage, and outputs the first signal and the second signal to the first phase difference measuring circuit in a succeeding stage.

Effect of the Invention

The present invention can shorten the measuring time by serially giving delay amounts in a plurality of portions at the same time, although the delay amounts are conventionally serially given in one portion.

BRIEF DESCRIPTION OF DRAWINGS

FIG. 3 is a block diagram showing practical example 1 of the first embodiment of the present invention;

BEST MODE FOR CARRYING OUT THE INVENTION

Embodiments of the present invention will be explained in detail below with reference to the accompanying drawings.

First Embodiment

Hierarchical Jitter Measuring Circuit

Figure 1:
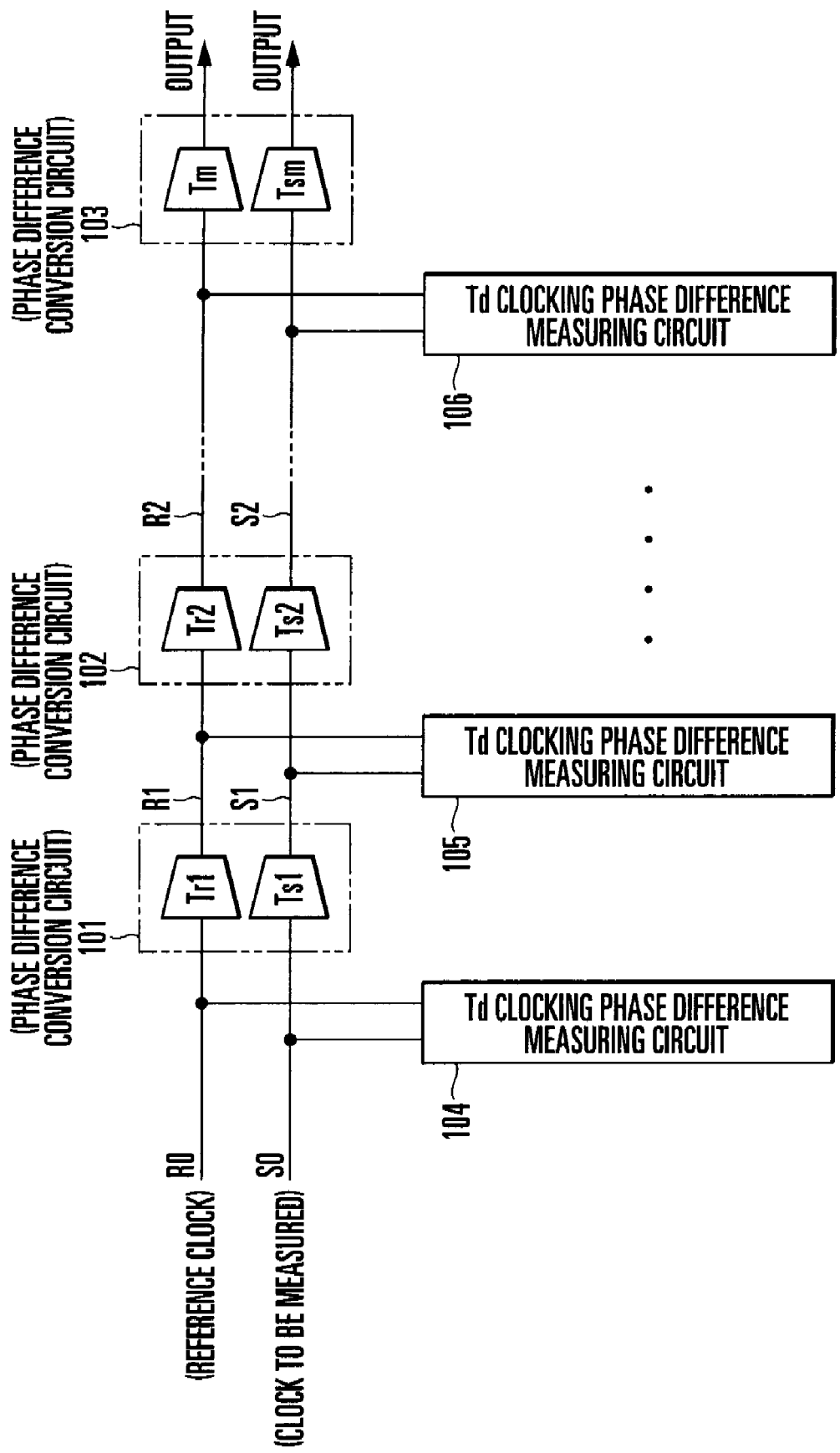
FIG. 1 is a block diagram showing an outline of the first embodiment of the present invention.

FIG. 1 is a block diagram showing an outline of the first embodiment of the present invention. A phase difference measuring device according to the first embodiment of the present invention comprises phase difference conversion circuits 101, 102, ..., 103 for changing the phase difference between two signals by a predetermined amount, and Td clocking phase difference measuring circuits 104, 105, ..., 106 capable of measuring the time difference between two input signals for every Td. Two input signals S0 and R0 are input to the phase difference measuring circuit 104 capable of measurements from 0 to (a1−1)×Td (a1 is an integer) at a resolution Td, and also input to the phase difference conversion circuit 101 that changes the phase difference between two signals by a1×Td, thereby generating two output signals S1 and R1. After that, S1 and R1 are input to the Td clocking phase difference measuring circuit 105 capable of measurements from a1×Td to (a1+a2−1)×Td (a2 is an integer) at the resolution Td, and also input to the phase difference conversion circuit 102 that changes the phase difference between two signals by a2×Td, thereby generating two output signals S2 and R2. Thus, the device has a structure obtained by hierarchically combining the phase difference conversion circuits 101, ... that shift a signal by a×Td (a is an integer), and the Td clocking phase difference measuring circuit 104, ... capable of measuring a signal for every Td.

When measuring a jitter m×Td at the resolution Td, the conventional technique requires m stages of phase difference measuring circuits, and the time required from signal input to final stage output is m×Ts where Ts is the delay of the phase difference measuring circuit. By contrast, in this embodiment, the number of stages of the phase difference conversion circuits 101 existing from the input stage to the final stage is p (a1+a2+ ... +ap=m). Accordingly, the time required from signal input to final stage output is (Ts×p) shorter than that in the conventional technique. This increases a maximum operating speed of this embodiment to 1/(Ts×p). Also, since a jitter value generated by the noise of a measuring circuit itself is almost proportional to the circuit delay, the jitter value in this embodiment improves p/m times.

Figure 2:
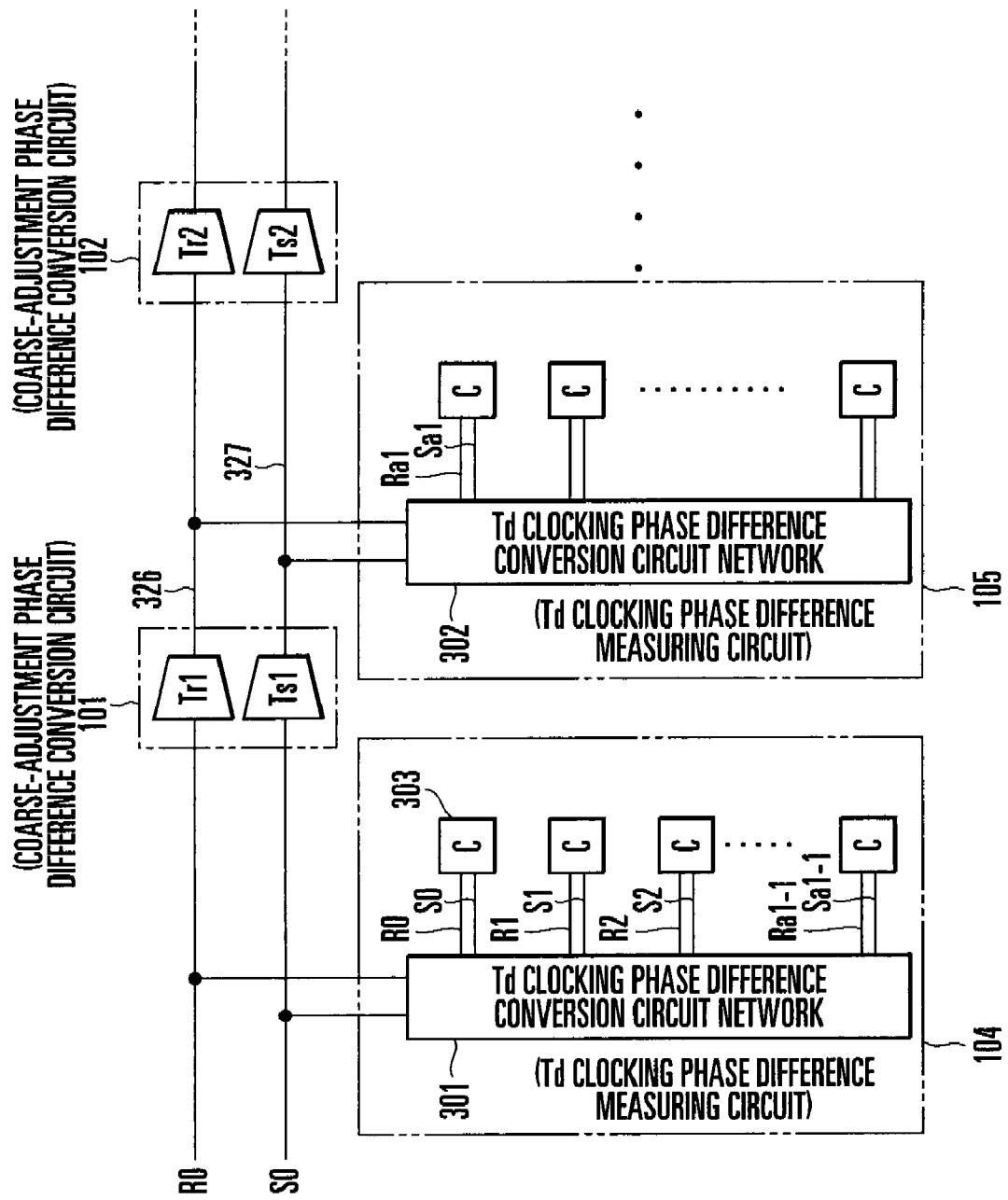
FIG. 2 is a block diagram showing the arrangement of a phase difference measuring device according to the first embodiment of the present invention.

This embodiment will be explained in more detail below. FIG. 2 is a block diagram showing the arrangement of the phase different measuring device according to the first embodiment of the present invention.

The phase difference measuring device according to this embodiment comprises the coarse-adjustment phase difference conversion circuits 101, 102, ..., 103, and the Td clocking phase difference measuring circuits 104, 105, ..., 106. The coarse-adjustment phase difference conversion circuit 101 has a delay circuit having a delay time of Ts1 and a delay circuit having a delay time of Tr1=Ts1+r×Td (r is an integer of 1 or more, and Td is the resolution of the measuring circuit). The Td clocking phase difference measuring circuit 104 comprises a Td clocking phase difference conversion circuit network 301 capable of outputting a1 signal pairs having a phase difference of Td, such as the signals R1 and S1 having a phase difference different by Td from that between the signals R0 and S0, and the signals R2 and S2 having a phase difference different by Td from that between the signals R1 and S2, and a plurality of phase comparators 303 that detect which one of the phases of the clocks of two signals leads the other, and output 0 or 1.

The coarse-adjustment phase difference conversion circuit 101 changes the phase difference between the signals R0 and S0 by a1×Td by setting r=a1 (a1 is an integer of 1 or more), and outputs these signals to the Td clocking phase difference measuring circuit 105 and coarse-adjustment phase difference conversion circuit 102 at the same time. The coarse-adjustment phase difference conversion circuit 102 changes the phase difference between the signals R1 and S1 by a2×Td by setting r=a2 (a2 is an integer of 1 or more). When this operation is repeated for n stages, the phase difference between the outputs from the nth stage changes by expression (1) from that between the signal S0 to be measured and the reference signal R0. That is, the jitter measuring range of the signal S0 to be measured is 0 to expression (1).

$$(a1+a2+ \ldots +an) \times Td \quad (1)$$

Figure 22:
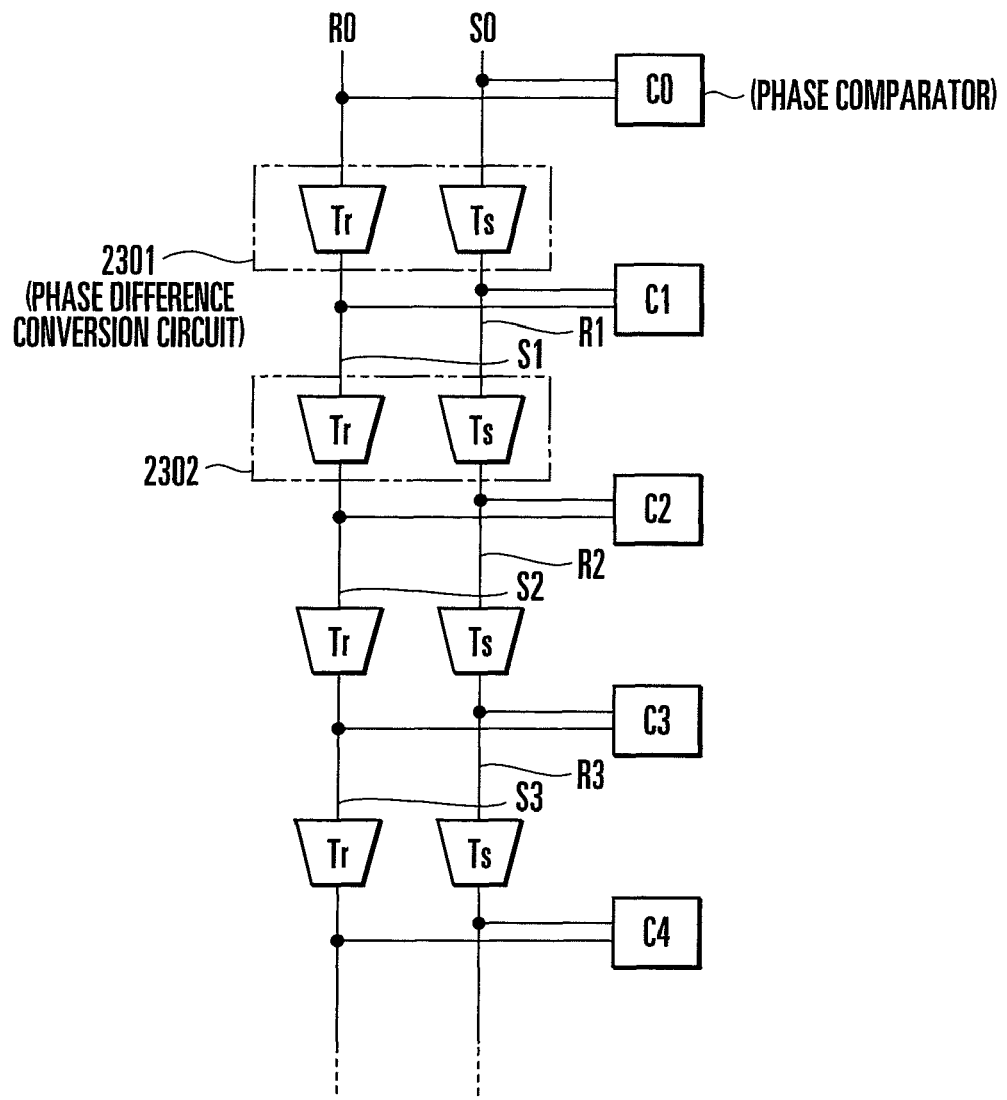
FIG. 22 is a block diagram showing the arrangement of a conventional phase difference measuring device improved in resolution.
Figure 23:
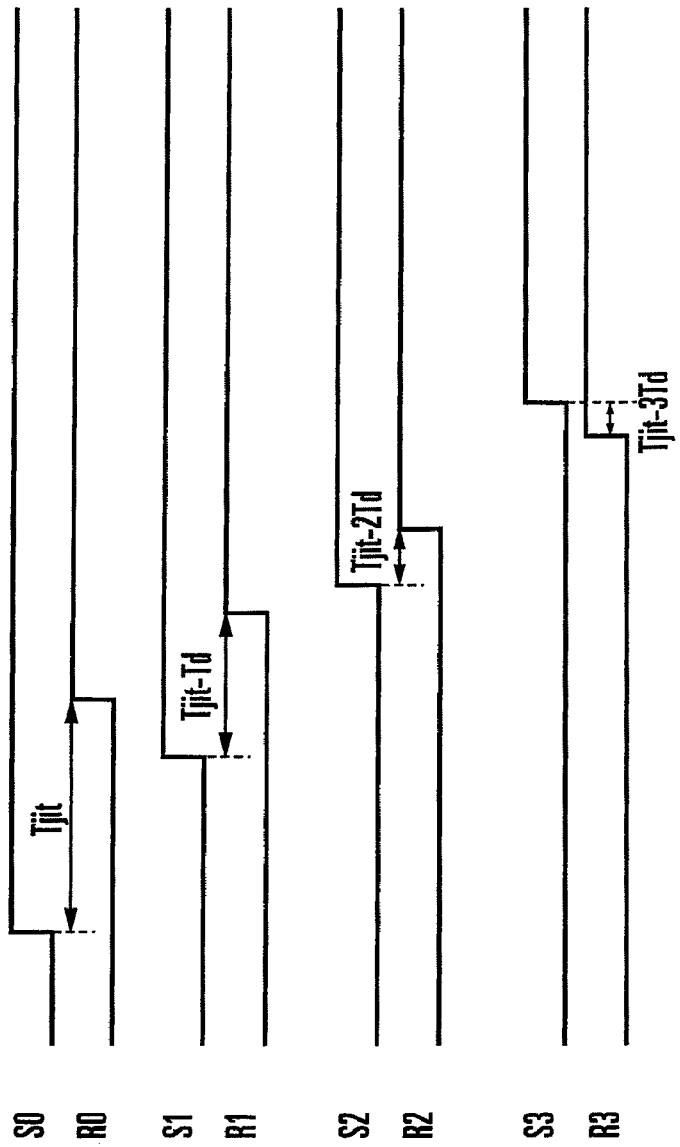
FIG. 23 is a timing chart showing the basic operation of the conventional phase difference measuring device shown in FIG. 22.
Figure 24:
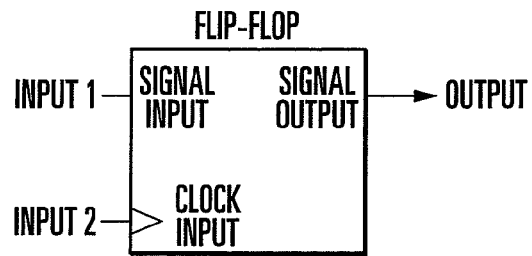
FIG. 24 is a block diagram showing an example of the arrangement of a conventional phase comparator.

In this case, the time required from inputting of the reference signal R0 to outputting of the signals from the coarse-adjustment phase difference conversion circuit in the nth stage is n×Ts. On the other hand, in the conventional method (FIG. 22) in which phase difference conversion circuits that change the phase difference by Td are cascaded, phase difference measuring circuits equal in number to expression (2) must be cascaded when shifting the phase by the value indicated by expression (1) from inputting of the reference signal R0.

$$a1+a2+ \ldots +an \quad (2)$$

In this case, the time required from inputting of the signal S0 to be measured and the reference signal R0 to outputting of the signals from the (a1+a2+ ... +an)th stage is indicated by $$(a1+a2+ \ldots +an) \times Ts \quad (3)$$

Expression (4) holds if one of a1 to an is 2 or more.

$$(a1+a2+ \ldots +an) > n \quad (4)$$

That is, the arrival time in this embodiment is shorter than that in the conventional method.

Practical Example 1

Example of Jitter Measuring Circuit Having Two Layers

FIG. 3 shows a two-layered structure using two types of phase difference conversion circuits r=1 and r=N.

As Td clocking phase difference measuring circuits 402, 403, ..., N fine-adjustment phase difference conversion circuits 401 having a phase difference Td are cascaded, and phase comparators C(0) to C(N−1) are connected to output signals from the N stages.

Figure 4A:
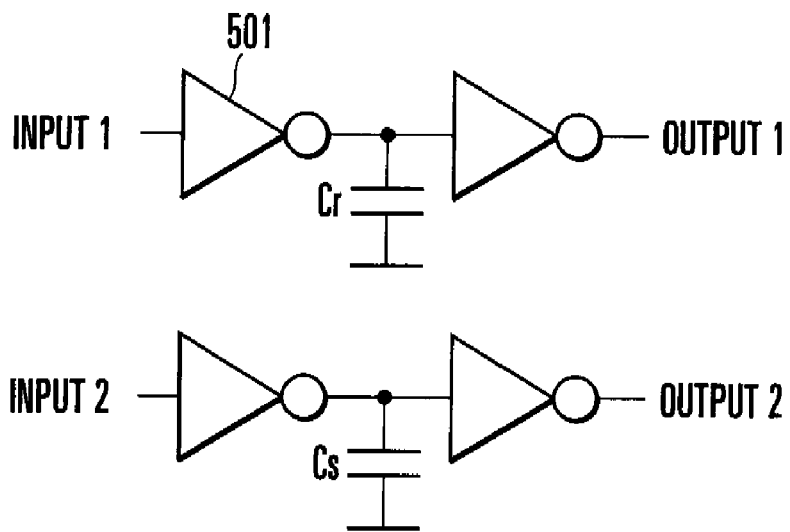
FIG. 4A is a block diagram showing an example of the arrangement of a fine-adjustment phase difference conversion circuit shown in FIG. 3.
Figure 4B:
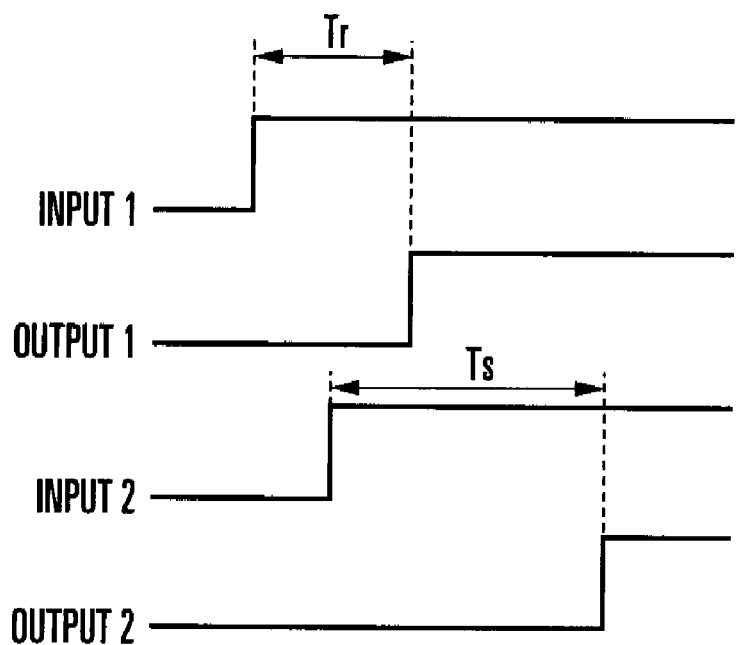
FIG. 4B is a timing chart showing input/output signals of the fine-adjustment phase difference conversion circuit shown in FIG. 3.

As shown in FIG. 4A, the fine-adjustment phase difference conversion circuit 401 having the phase difference Td includes two delay elements: a first delay element comprises two stages of CMOS inverters 501 and a load capacitance Cr formed in an intermediate path between the CMOS inverters 501; and a second delay element comprises two stages of CMOS inverters 501 and a load capacitance Cs formed in an intermediate path between the CMOS inverters 501. As shown in FIG. 4B, a delay time Tr from input 1 to output 1 and a delay time Ts from input 2 to output 2 are generated by designing the circuit so that the load capacitance Cr of the inverter 501 driven by input 1 and the load capacitance Cs of the inverter 501 driven by input 2 have different values, thereby generating output signals having a time difference of Td. Ts is the delay of the two inverters 501, and hence cannot be made shorter than this delay of the two inverters 501. However, Td can be set to an arbitrary value of 0 or more by appropriately designing Cr and Cs.

Figure 5:
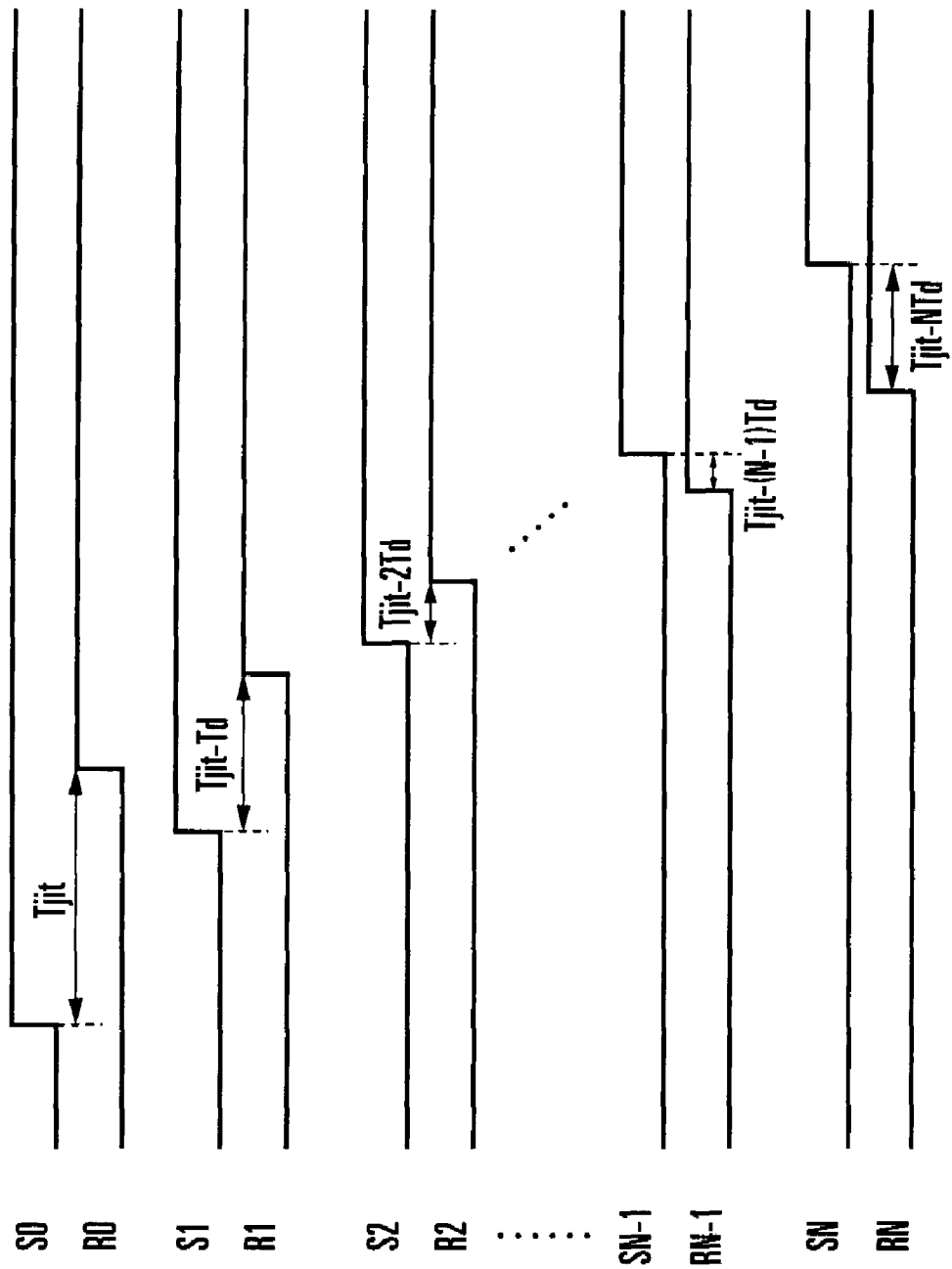
FIG. 5 is a timing chart showing the basic operation of a phase difference measuring circuit shown in FIG. 3.

FIG. 5 shows the operation timings of the Td clocking phase difference measuring circuit 402. Letting Tjit be the phase difference between the signal S0 to be measured and the reference signal R0, the phase difference between two input signals input to each of the phase comparators C(0) to C(N−1) shifts by every Td from Tjit to Tjit−(N−1)×Td. After passing through a coarse-adjustment phase difference measuring circuit 406, the signal S0 to be measured and the reference signal R0 enter the Td clocking phase difference measuring circuit 403. Since the coarse-adjustment phase difference measuring circuit 406 increases the phase difference between two signals by Ts1−Tr1=N×Td, the phase difference between two signals input to each of the phase comparators C(N) to C(2N−1) is Tjit−N×Td to Tjit−(2N−1)×Td. Therefore, the difference between the phase difference between two signals (the phase difference between SN−1 and RN−1) input to the final stage C(N−1) of the Td clocking phase difference measuring circuit 402 and the phase difference between two signals (SN and RN) input to the initial stage C(N) of the Td clocking phase difference measuring circuit 403 is Td. Accordingly, the phase difference measuring circuits are implemented such that phase clocking (Td) is constant between the adjacent Td clocking phase difference measuring circuits 402 and 403.

When two signals to be input to the phase comparator C(k×N−1) in the final stage are passed through the kth Td clocking phase difference measuring circuit and kth coarse-adjustment phase difference conversion circuit, the phase difference between the two signals is Tjit−(k×N−1)×Td. Therefore, the range of measurable jitters is 0 to (k×N−1)×Td. On the other hand, the time at which the signals arrive at the phase comparator C(k×N) in the final stage is ((k−1)+N)×Ts largely shorter than the arrival time k×N×Ts when no two-layered structure is used.

Practical Example 2

Figure 6:
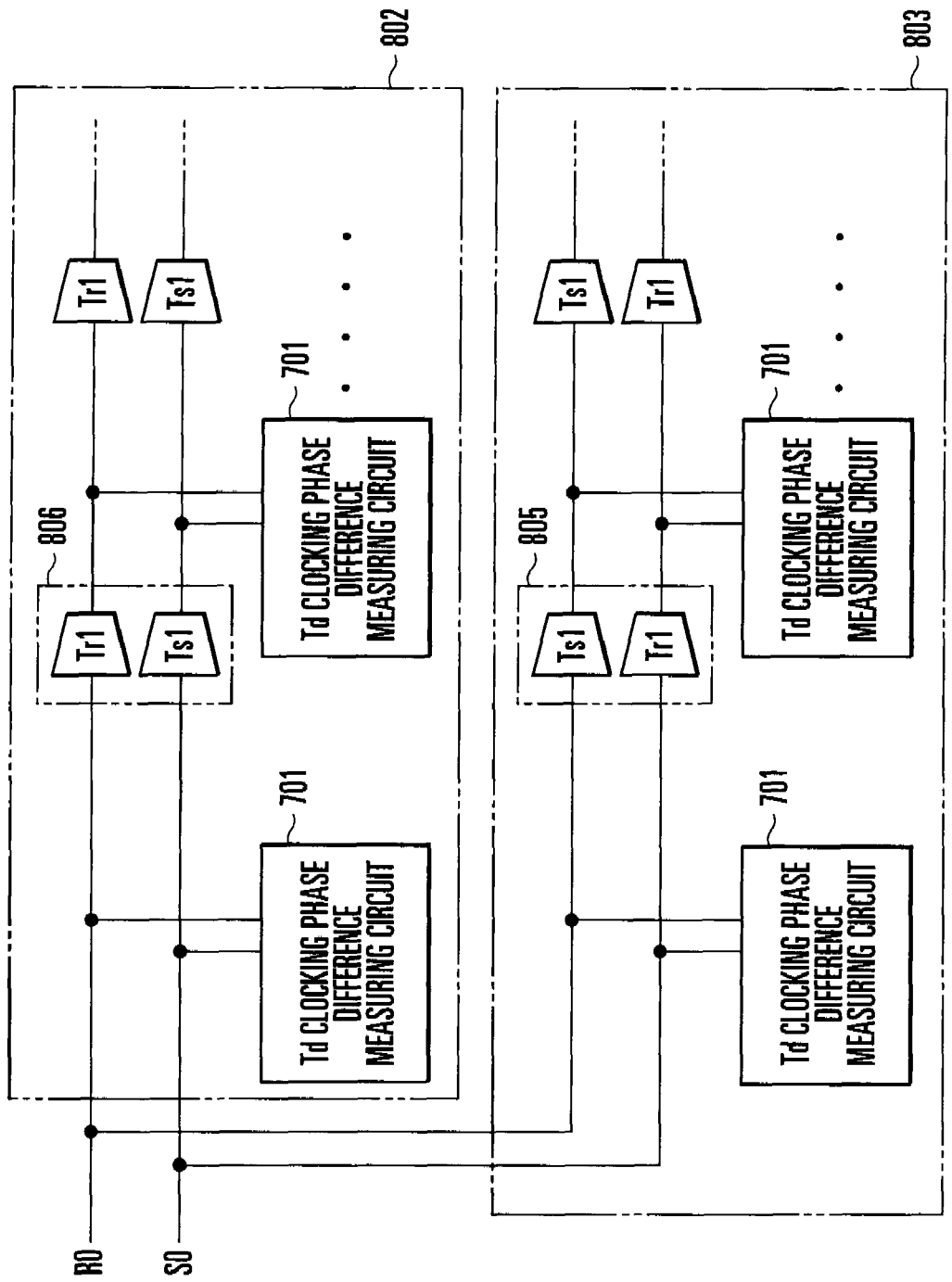
FIG. 6 is a block diagram showing an arrangement that doubles the operating range, as practical example 2 of the first embodiment of the present invention.

Example of Jitter Measuring Circuit Capable of Securing Double Measuring Range for the Same Measuring Time As an example of the extension of practical example 1 described above, FIG. 6 shows an arrangement capable of doubling the measuring range while maintaining the time required until the final stage.

Similar to practical example 1, this practical example has an arrangement in which a second measuring circuit 803 is connected in parallel to a first measuring circuit 802 capable of measurements within the range of 0 to R×N×Td. The arrangement of an internal phase difference conversion circuit 805 of the second measuring circuit 803 differs from that of a phase difference conversion circuit 806 of the first measuring circuit 802 in that Tr1 is connected to the signal R0 side and Ts1 is connected to the signal S0 side. Accordingly, the operating range of the second measuring circuit 803 is 0 to −R×N×Td opposite to the operating range of 0 to R×N×Td of the first measuring circuit 802. When the measurement results of the first and second measuring circuits 802 and 803 are combined, therefore, the overall measuring range is −R×N×Td to R×N×Td.

This practical example has the feature that the time required from the inputting of two signals to the completion of measurements is the same as that when one measuring circuit is used, because the measuring circuits 802 and 803 operate simultaneously.

Figure 7:
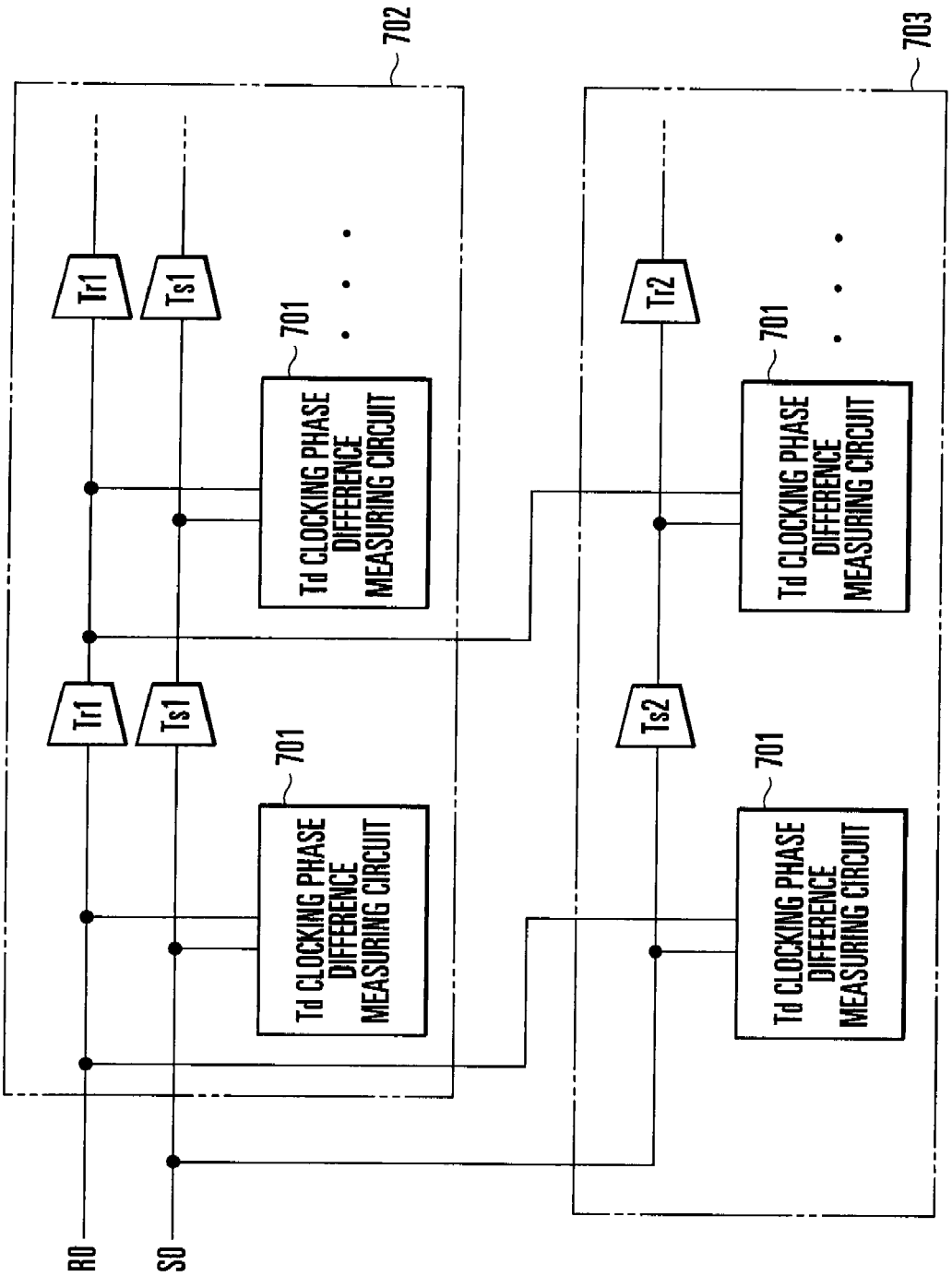
FIG. 7 is a block diagram showing an arrangement that doubles the operating range and can also reduce the number of elements in a coarse-adjustment phase difference conversion circuit, as practical example 2 of the first embodiment of the present invention.

In addition, as shown in FIG. 7, the measuring range of −R×N×Td to R×N×Td described above can be achieved by arranging Ts1 and Ts2 in measuring circuits 702 and 703 such that Ts1−Tr1 is N×Td and Ts2−Tr1 is −N×Td. Furthermore, coarse-adjustment phase difference conversion circuits through which the R0 sides of the two measuring circuits 702 and 703 pass have the same delay amount Tr1. As shown in FIG. 7, therefore, the R0-side delay element output in the coarse-adjustment phase difference conversion circuit used in the measuring circuit 702 can also be used in the measuring circuit 703. This makes it possible to reduce the number of the delay elements from that of the phase difference measuring device shown in FIG. 6.

Second Embodiment

Figure 8:
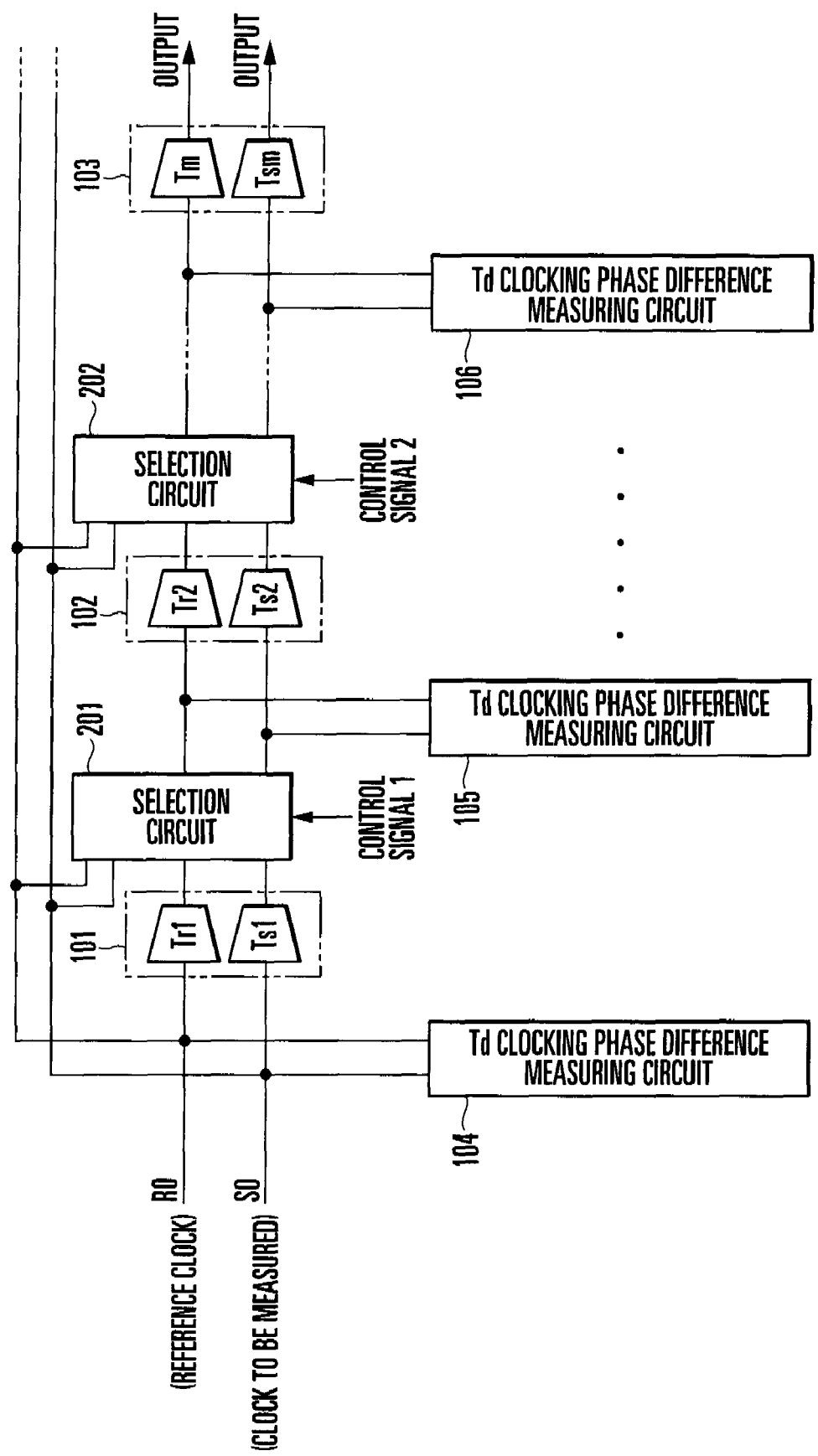
FIG. 8 is a block diagram showing the arrangement of a phase difference measuring device according to the second embodiment of the present invention.

Jitter Measuring Circuit Capable of Switching Inputs to Phase Difference Measuring Circuits FIG. 8 is a block diagram showing the arrangement of a phase difference measuring device according to the second embodiment of the present invention. This phase difference measuring device has selection circuits 201, 202, . . . for selecting whether to connect the inputs of phase difference measuring circuits 105, 106, . . . to the outputs of phase difference measuring circuits 101, 102, . . . in the preceding stage or to input signals S0 and R0. It is possible to select the former when widening the measuring range and the latter when increasing the measurement resolution by using control signals 1 and 2.

The measuring range can be increased the number of times equal to the number of stages by cascading the input from the phase difference measuring circuit 105 to the phase difference measuring circuit 101 in the preceding stage. On the other hand, when the inputs from the n phase difference measuring circuits 105, 106, . . . are connected in parallel to the signal S0 to be measured, a jitter of the signal S0 to be measured can be measured n times at the same time. This makes it possible to reduce the influence of variations or noise of the phase difference measuring circuits 105, 106, . . . . Furthermore, since the output time of a waveform in which the phase difference between two inputs is shifted by a phase difference of q×Td in each measuring circuit block is shorter than q×Ts in the hierarchical structure described above, the increase in delay time is effectively made smaller than that in the conventional device even when the measuring circuit blocks are cascaded.

This embodiment will be explained in more detail below. The phase difference measuring device according to this embodiment comprises Td clocking phase difference measuring circuits 104, 105, . . . , 106 having a phase difference measuring range up to ai×Td (i=1, 2, 3, . . . , m) at a resolution Td, coarse-adjustment phase difference conversion circuits 101, 102, . . . , 103 for changing the phase difference between two inputs by ai×Td, and the selection circuits 201, 202, . . . capable of selecting whether to use output signals from a coarse-adjustment phase difference conversion circuit in the preceding stage or the signal S0 to be measured and the reference signal R0, as input signals to each measuring circuit.

The jitter measuring range of the signal S0 to be measured can be widened by selecting the outputs from the coarse-adjustment phase difference conversion circuit in the preceding stage as the input signals by the selection circuits 201 and 202. For example, when this selection is done by all the selection circuits 201, 202, . . . , the range of measurable jitters can be widened from 0 to (a1+a2+ . . . +am)×Td.

On the other hand, the measuring range cannot be widened if the signal S0 to be measured and the reference signal R0 are selected as the inputs to the S Td clocking phase difference measuring circuits 104, 105, . . . , 106 by switching control signals 1 and 2 for respectively controlling the selection circuits 201 and 202. Instead, however, the S Td clocking phase difference measuring circuits 104, 105, . . . , 106 simultaneously perform measurements in the same measuring range. By averaging the results, therefore, it is possible to obtain highly accurate values by reducing noise components, such as thermal noise of the Td clocking phase difference measuring circuits 104, 105, . . . , 106 or delay circuit variations caused by process variations, by $1/\sqrt{S}$ times. The number of times of repetitive measurements and the measuring range can be dynamically adjusted by thus switching the cascaded connection and parallel connection of the Td clocking phase difference measuring circuits 104, 105, . . . , 106.

Practical Example 1

Example of Jitter Measuring Circuit Having Two Layers

Figure 9:
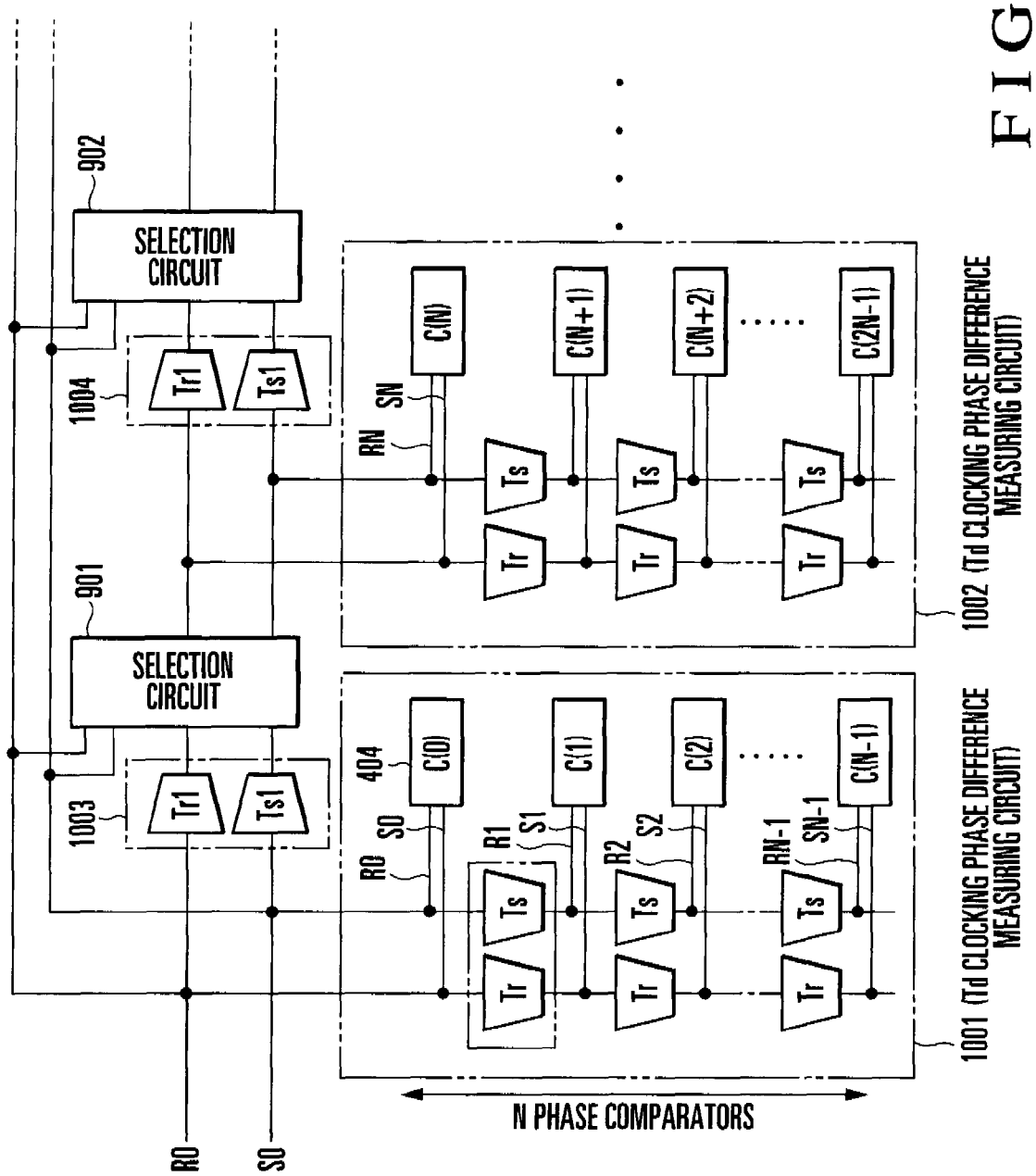
FIG. 9 is a block diagram showing practical example 1 of the second embodiment of the present invention.
Figure 10A:
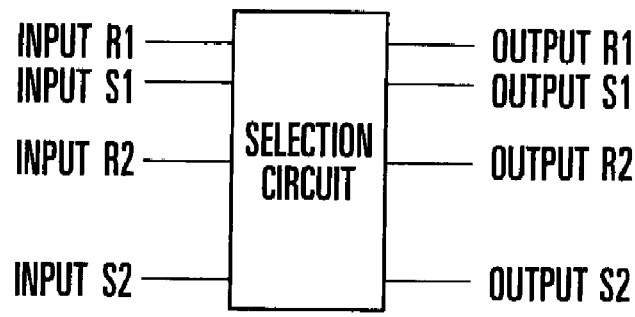
FIG. 10A is a block diagram of a selection circuit shown in FIG. 9.
Figure 10B:
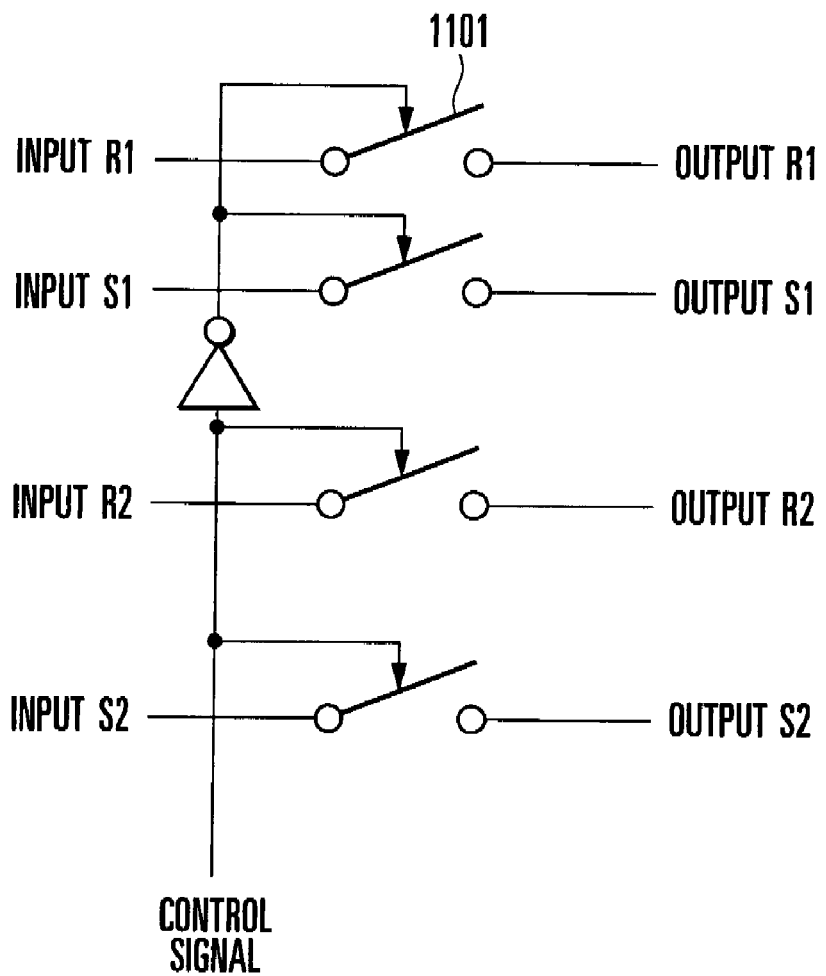
FIG. 10B is a circuit diagram of the selection circuit corresponding to FIG. 10A.

As a practical example of this embodiment, FIG. 9 shows an arrangement using two selection circuits shown in FIG. 8. As shown in FIGS. 10A and 10B, selection circuits 901 and 902 adopt a method which connects two input pairs (R1, S1) and (R2, S2) to switches 1101, and select whether to extract the input signals as outputs by a control signal. Each switch 1101 is turned on when the control signal is at high level, and turned off when the control signal is at low level. The control signal is directly supplied to the switches 1101 to which the inputs R2 and S2 are connected, but an inverted signal of the control signal is supplied to the switches 1101 to which the inputs R1 and S1 are connected. Accordingly, the inputs R1 and S1 or the inputs R2 and S2 are extracted as outputs R1 and S1 or outputs R2 and S2, respectively, by the control signal.

Figure 11:
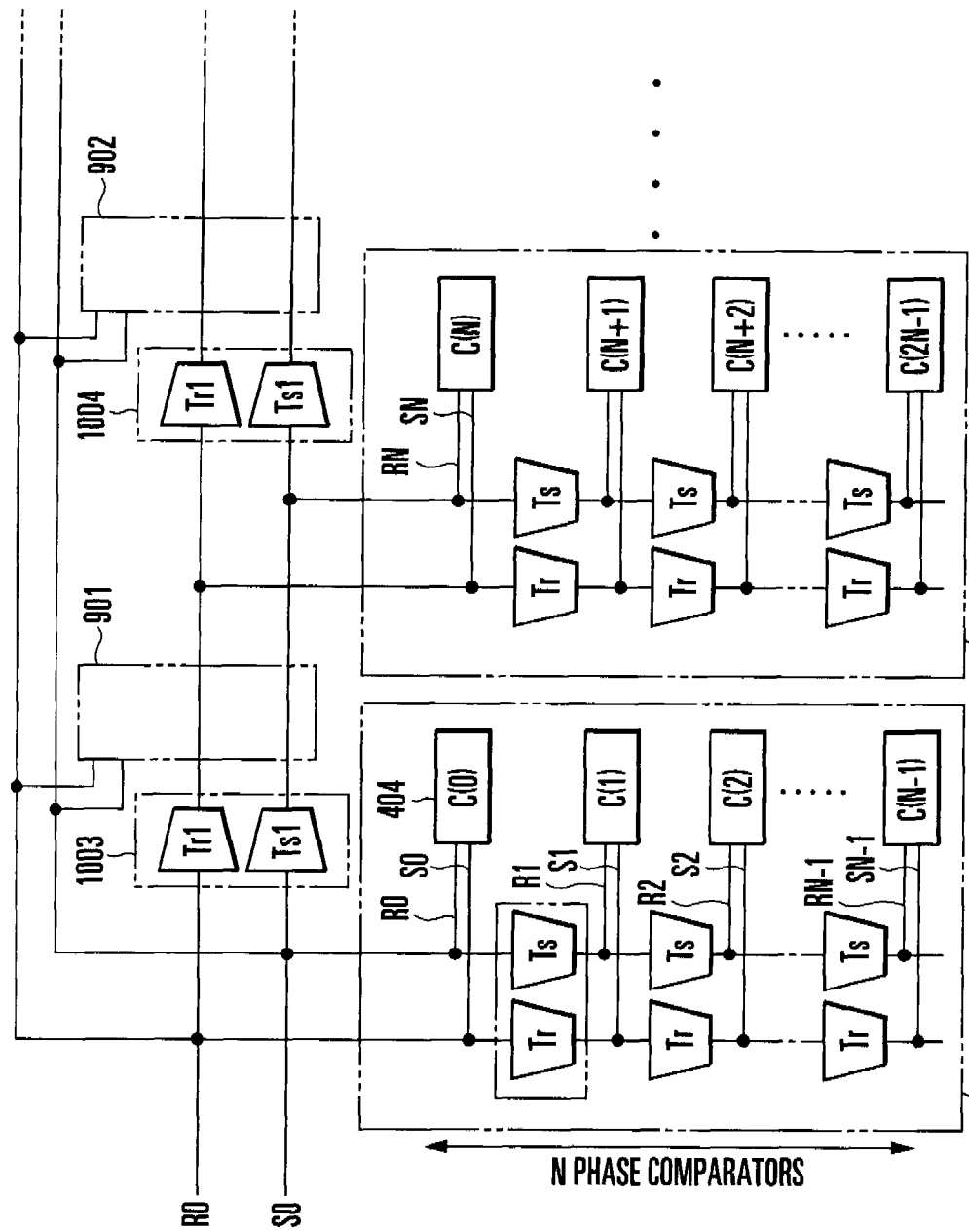
FIG. 11 is a block diagram showing connections when a control signal of the selection circuit of a phase difference measuring device shown in FIG. 9 is at high level.

Letting Tjit be the phase difference between the signal S0 to be measured and the reference signal R0, the range of measurable jitters of a Td clocking phase difference measuring circuit 1001 is 0 to N×Td, and the phase difference between two signal outputs from a coarse-adjustment phase difference conversion circuit 1003 is Tjit−N×Td. In a cascaded connection as shown in FIG. 11 in which the outputs from a coarse-adjustment phase difference conversion circuit 1003 are input to a coarse-adjustment phase difference conversion circuit 1004 in the succeeding stage by setting the control signal to be supplied to the selection circuit 901 at high level, the measuring range of a Td clocking phase difference measuring circuit 1002 is (N+1)×Td to (2×N)×Td. Therefore, a combination of the Td clocking phase difference measuring circuits 1001 and 1002 can perform measurements within the range of 0 to (2×N)×Td at the resolution Td.

Figure 12:
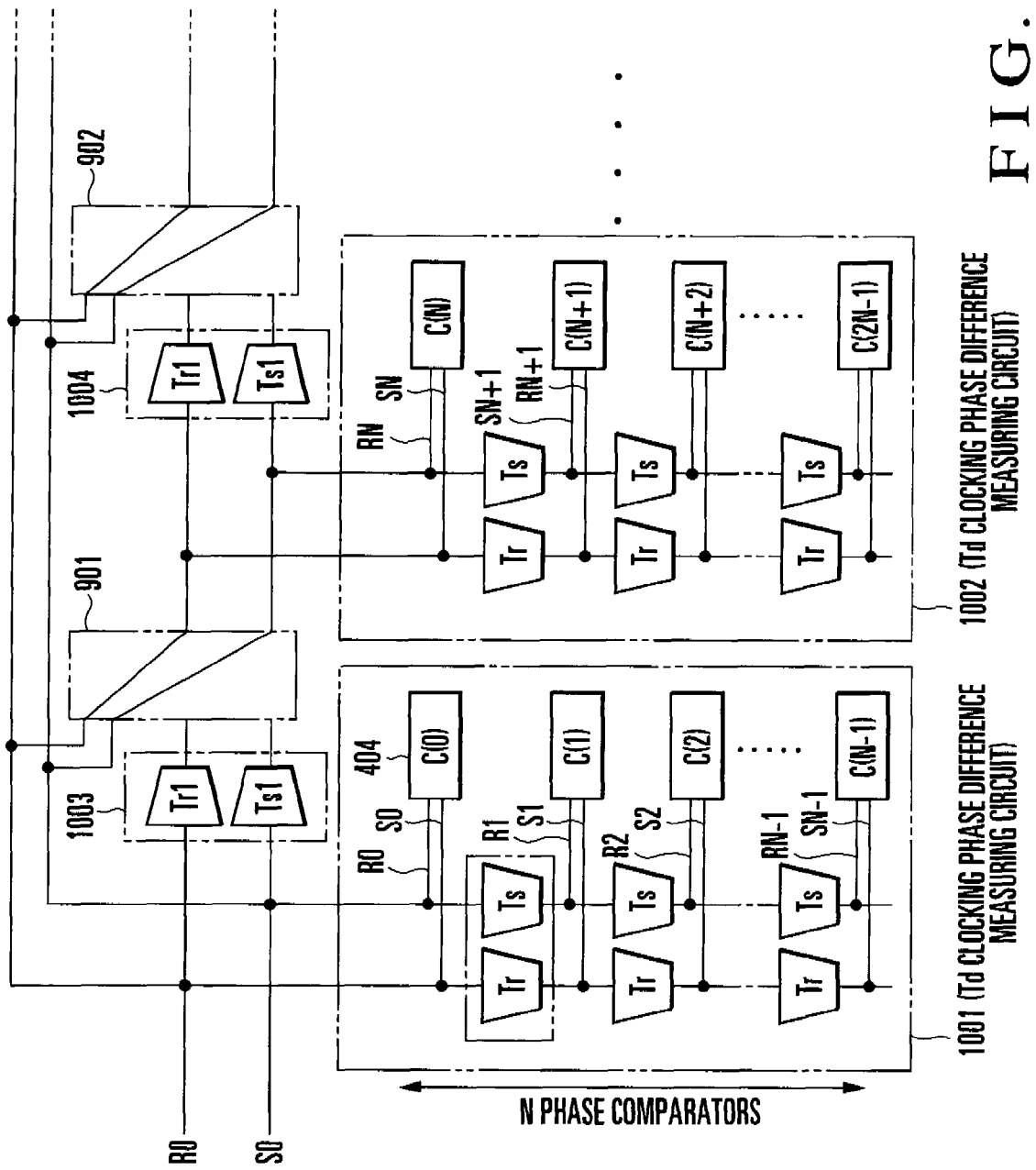
FIG. 12 is a block diagram showing connections when the control signal of the selection circuit of the phase difference measuring device shown in FIG. 9 is at low level.

On the other hand, when the signal S0 to be measured and the reference signal R0 are selected as the inputs to each of the Td clocking phase difference measuring circuits 1001 and 1002 as shown in FIG. 12 by setting the control signal to be supplied to the selection circuit 901 at low level, the measuring range is 0 to N×Td. However, the two Td clocking phase difference measuring circuits 1001 and 1002 perform measurements in the same measuring range. By averaging the results, therefore, measurement errors resulting from thermal noise of the Td clocking phase difference measuring circuits 1001 and 1002 or noise such as delay circuit variations caused by process variations can be reduced by $1/\sqrt{2}$ times.

Third Embodiment

Circuit for Adjusting Offset of Phase Difference Measuring Circuit

Figure 13:
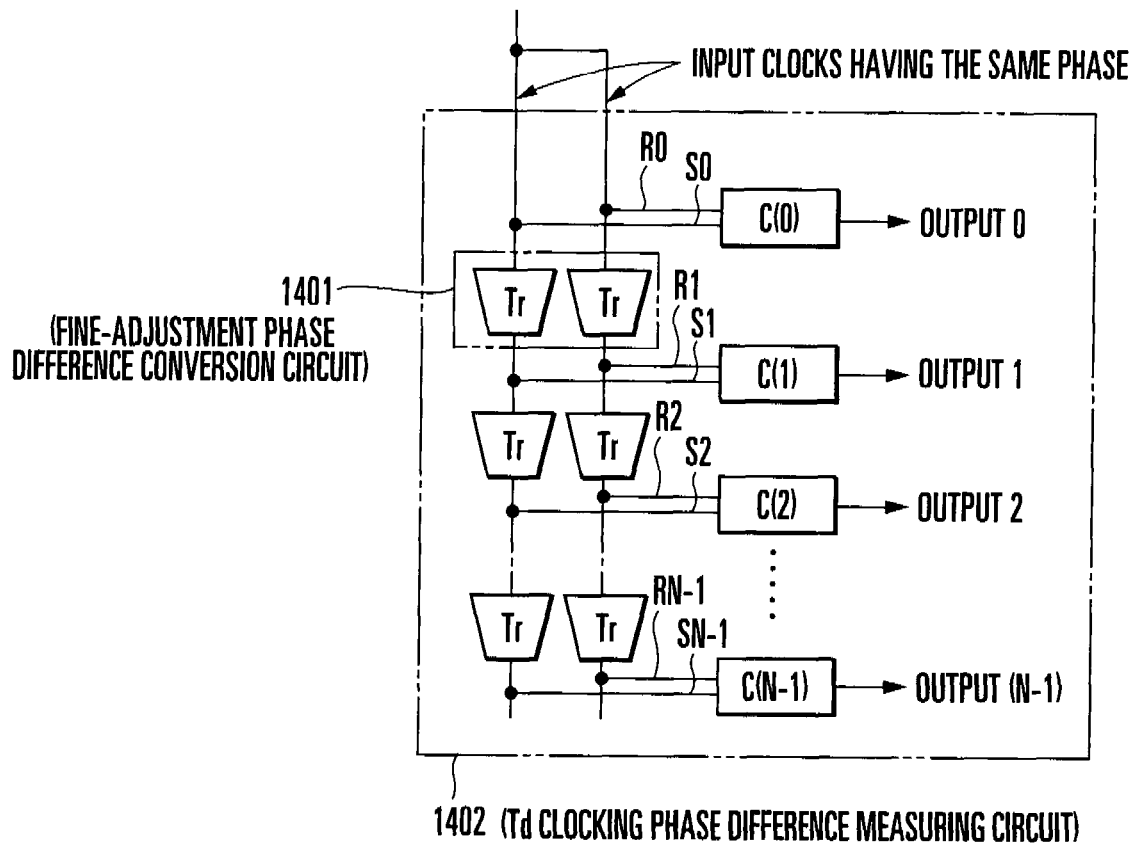
FIG. 13 is a block diagram showing the arrangement of a Td clocking phase difference measuring circuit of a phase difference measuring device according to the third embodiment of the present invention.

FIG. 13 is a block diagram showing the arrangement of a Td clocking phase difference measuring circuit in a phase difference measuring device according to the third embodiment of the present invention. In this embodiment, while the delay amounts of delay elements forming a fine-adjustment phase difference conversion circuit 1401 in a Td clocking phase difference conversion circuit 1402 are made equal, identical signals are input to the Td clocking phase difference conversion circuit 1402, and the measurement results obtained by phase comparators C0, C1, . . . , C(N−1) are observed, thereby adjusting the offset in order from the upper bit, i.e., the first phase comparator C0. This makes it possible to perform offset adjustment requiring neither a special input signal nor special data processing. This shortens the offset adjusting time, and obviates the need for an additional circuit for generating an offset adjusting signal and a complicated control algorithm.

Figure 14:
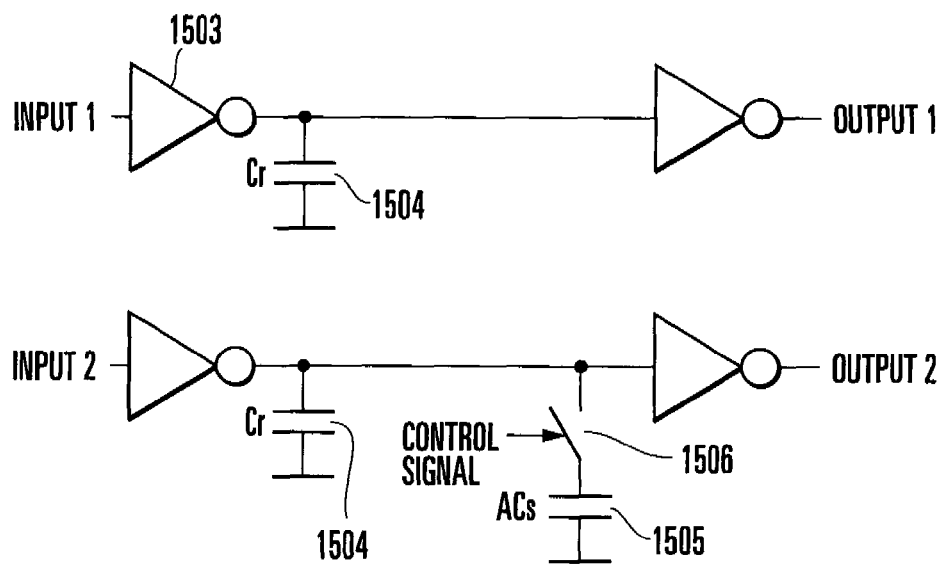
FIG. 14 is a circuit diagram of a fine-adjustment phase difference conversion circuit shown in FIG. 13.

This embodiment will be explained in more detail below. FIG. 14 shows a circuit diagram of the fine-adjustment phase difference conversion circuit 1401. An inverter 1503 and capacitor 1504 are set such that the delay amount from input 1 to output 1 is Tr. On the other hand, the delay amount from input 2 to output 2 changes in accordance with a control signal; a capacitance Cs (=Cr+ACs) is designed such that the delay amount is Tr when the control signal is turned off, and Ts when the control signal is turned on.

Figure 15:
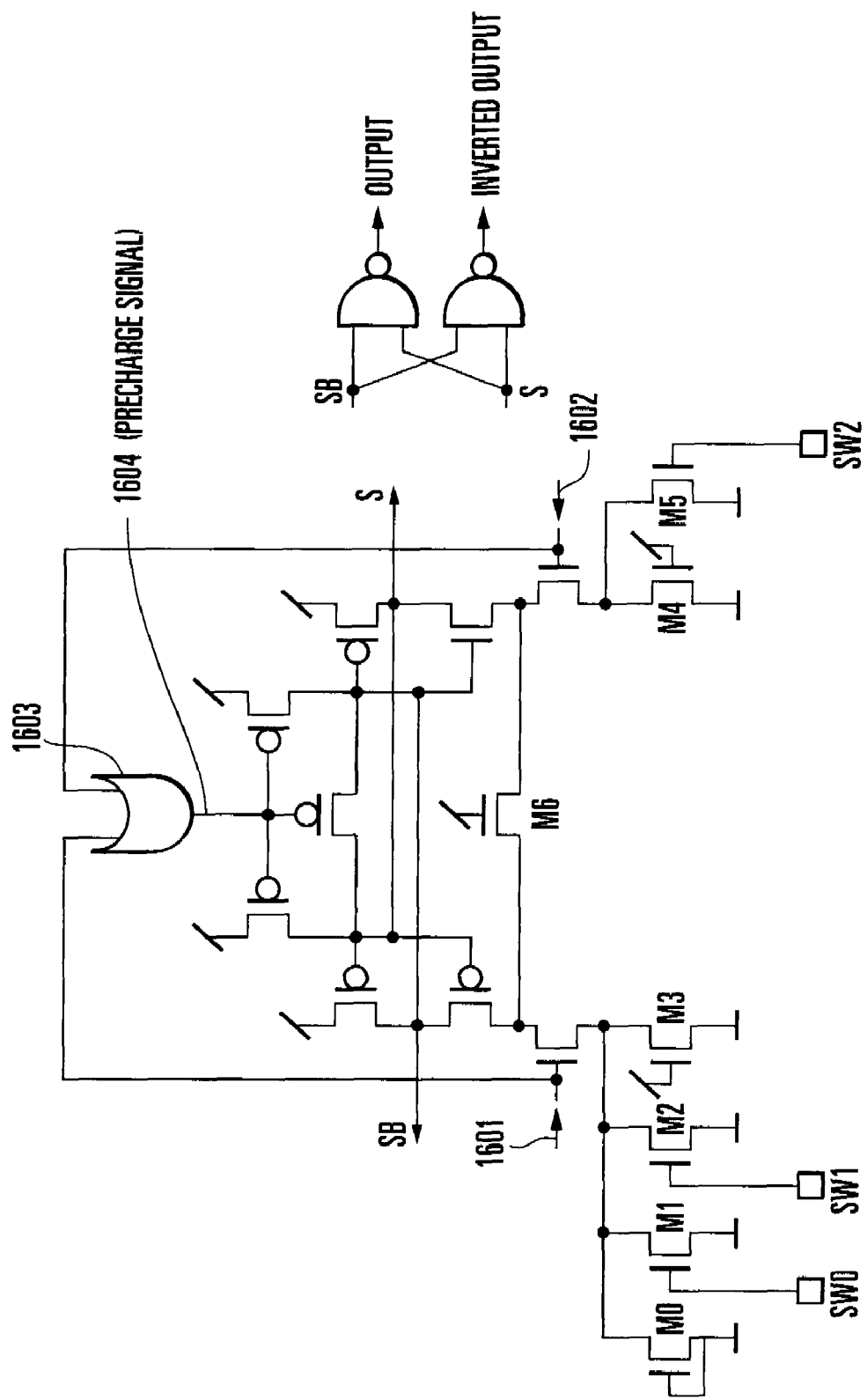
FIG. 15 is a circuit diagram of an offset-controllable phase comparator shown in FIG. 13.
Figure 25:
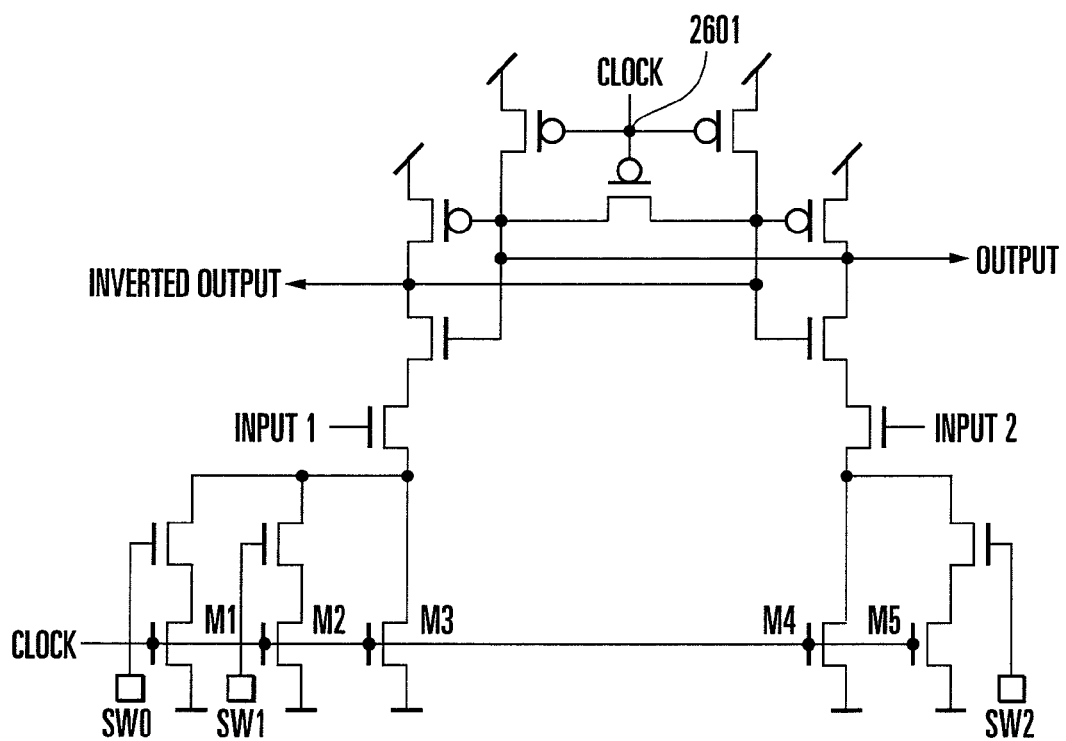
FIG. 25 is a circuit diagram showing an example of the arrangement of a conventional offset-adjustable phase comparator.

A precharge circuit as shown in FIG. 15 is used as the phase comparators C0, C1, . . . . Offset correction can be performed by inputting proper digital values to offset control terminals SW0 to SW2. Unlike the conventional circuit shown in FIG. 25, this circuit generates a precharge signal 1604 by ORing two input signals 1601 and 1602 by an OR gate 1603. In this configuration, when both the two input signals 1601 and 1602 are at low level, a precharge state is set, and output terminals S and SB are set at high level. On the other hand, when one of the two input signals 1601 and 1602 changes to high level, the precharge signal 1604 instantaneously changes to high level to terminate precharging, and a phase comparison state is started by drawing the electric charge from one of the output terminals S and SB. Since the precharge state and phase comparison state can be determined from the states of the two input signals 1601 and 1602, therefore, the circuit can operate without using an external sync signal (clock) necessary in the conventional circuit shown in FIG. 25.

Figure 16A:
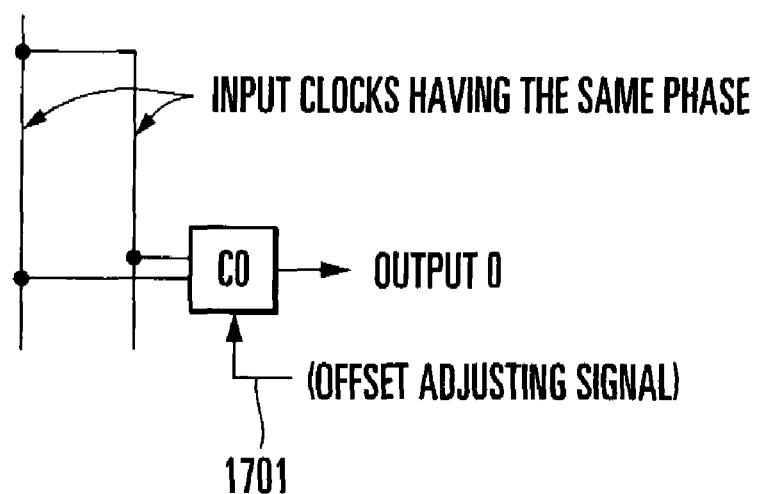
FIGS. 16A to 16C are views showing the procedure of offset adjustment.
Figure 16B:
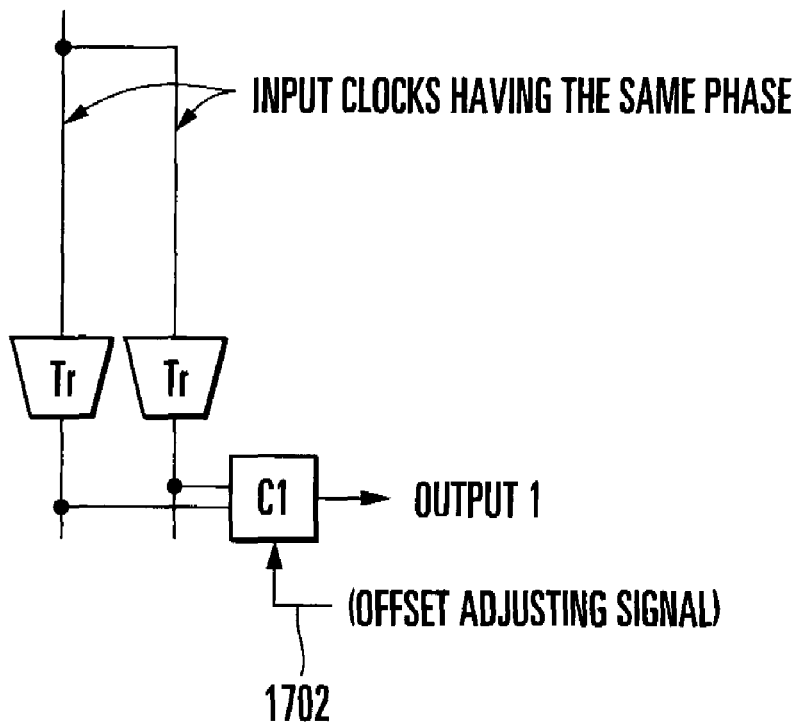
Figure 16C:
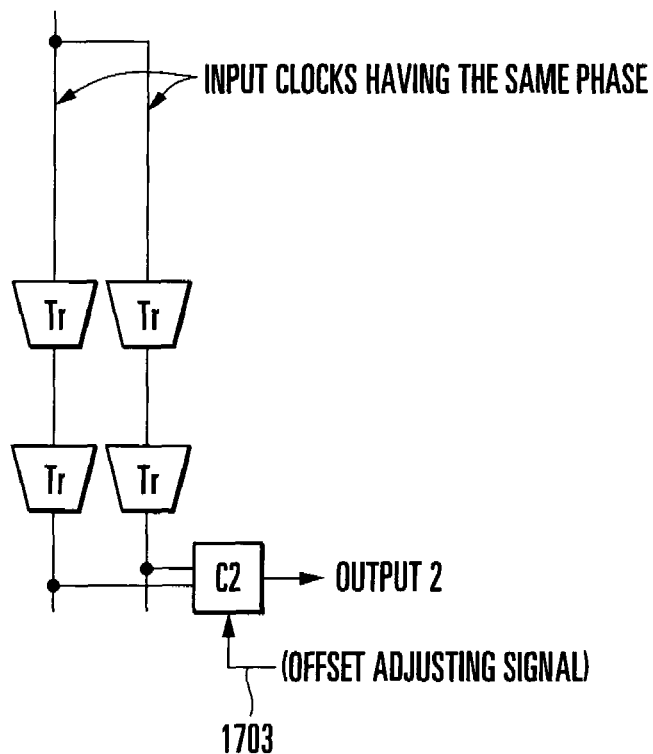

FIG. 16 shows the procedure of offset adjustment. First, the control signal shown in FIG. 14 is turned off to make the delays of all the delay elements equal (Tr). In addition, the two input signals are set to have in-phase clocks. First, as shown in FIG. 16A, correction is started from the phase comparator C0 closest to the input stage. More specifically, an offset control signal 1701 of the phase comparator C0 is changed to find a control signal 1701 by which the probability at which the level of an output signal (output 0) from the phase comparator C0 goes high and the probability at which this level goes low are equal. Thus setting the two probabilities equal eliminates an error caused by the offset of the phase comparator C0, i.e., a phenomenon in which the input phase difference that inverts the phase comparator C0 deviates from 0, and achieves a normal operation in which the value of the phase comparator C0 switches between "0" and "1" in accordance with whether the input clock phase difference is larger than 0. After that, as shown in FIG. 16B, the same setting is performed for the phase comparator C1 as the second phase comparator from the input stage. After that, as shown in FIG. 16C, the same setting is performed for the phase comparator C2 as the third phase comparator from the input stage. By thus sequentially performing the same setting for the fourth phase comparator, the fifth phase comparator, ..., the variation components of all the delay elements and phase comparators are corrected. After the correction, the control signal shown in FIG. 14 is changed to set the delay amount of one delay element to Ts, thereby achieving the same operation as in the first embodiment shown in FIG. 1.

Figure 17:
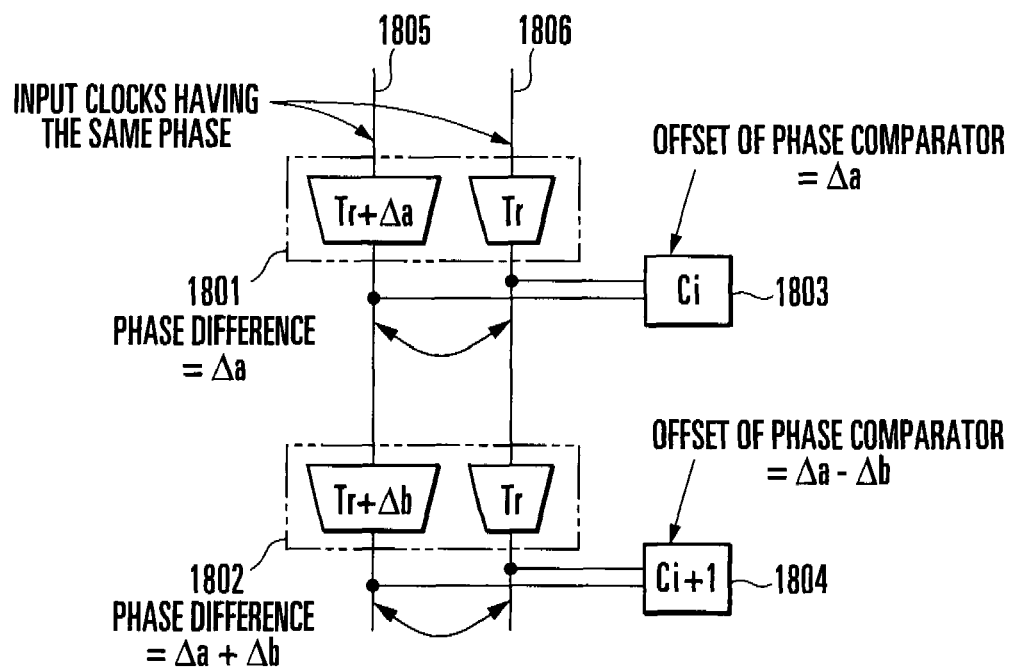
FIG. 17 is a view showing the state of offset adjustment when the fine-adjustment phase difference conversion circuit shown in FIG. 13 has a delay offset.
Figure 18:
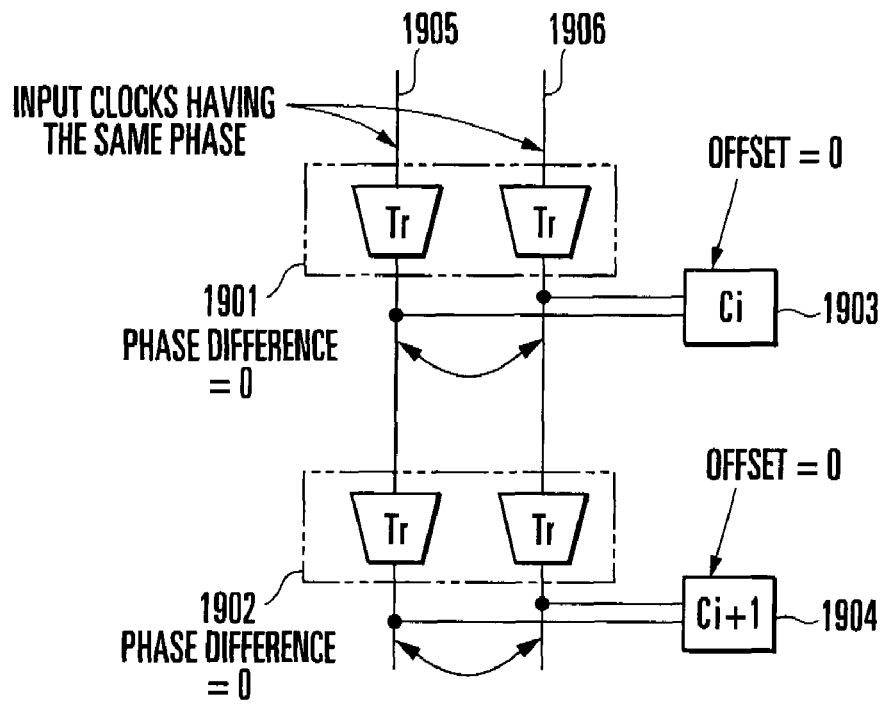
FIG. 18 is a view showing the state of offset adjustment when the fine-adjustment phase difference conversion circuit shown in FIG. 13 has no delay offset.
Figure 19:
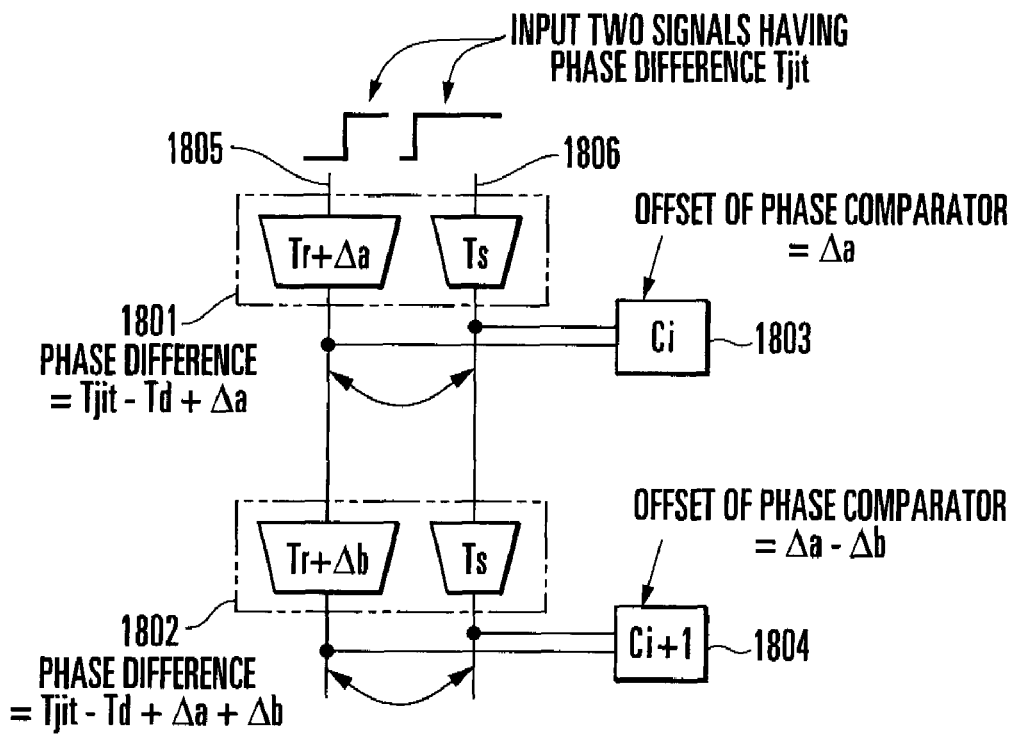
FIG. 19 is a view showing an operation state after the offset adjustment when the fine-adjustment phase difference conversion circuit shown in FIG. 13 has a delay offset.
Figure 20:
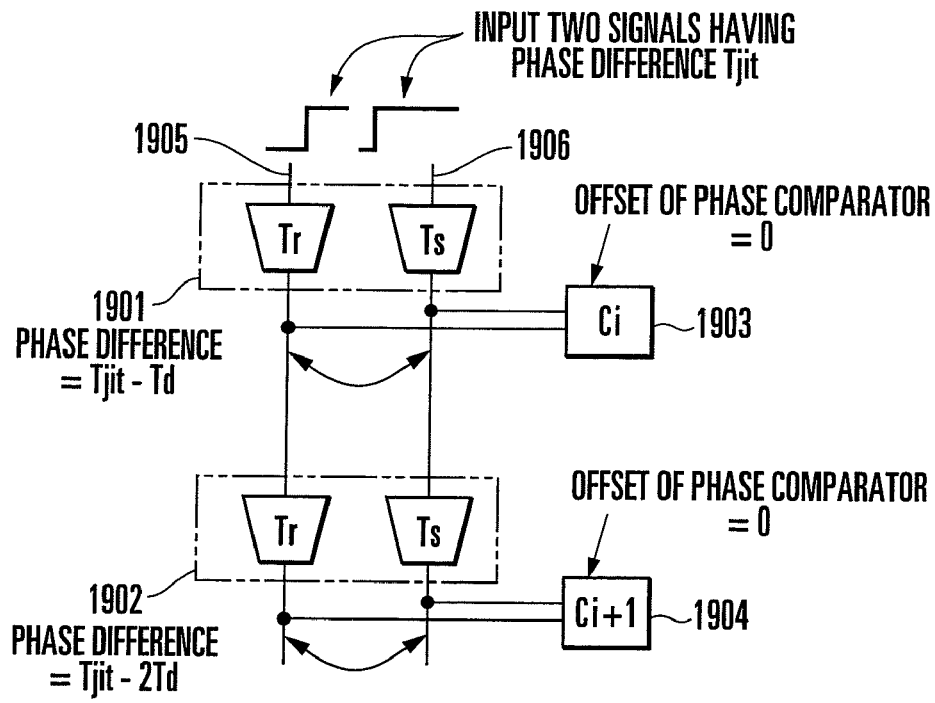
FIG. 20 is a view showing an operation state after the offset adjustment when the fine-adjustment phase difference conversion circuit shown in FIG. 13 has no delay offset.
Figure 21:
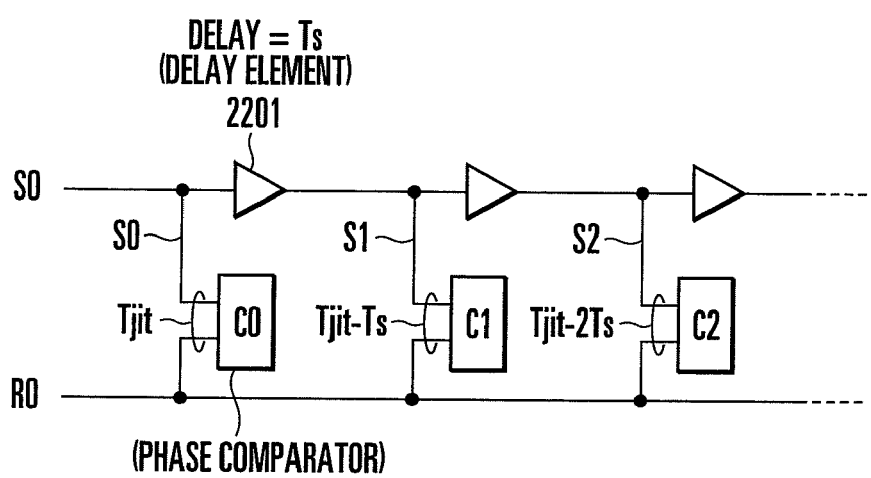
FIG. 21 is a block diagram showing the arrangement of a conventional phase difference measuring device.

This embodiment is characterized by simultaneously performing delay correction of the delay elements and offset correction. This feature will be explained below with reference to FIGS. 17 to 20. FIG. 17 shows the operation of offset adjustment in a circuit in which delay elements have variations. Assume that the delay difference between two delay elements in a fine-adjustment phase difference conversion circuit 1801 is not 0 as an ideal state but Δa owing to the delay amount variations of the delay elements. Since the phase difference between two signals input to a phase comparator Ci is Δa, the offset amount of the phase comparator Ci by which the probability at which the level of an output signal (output 0) from the phase comparator Ci goes high and the probability at which this level goes low are equal is −Δa. After this offset correction is performed, the variation amount of the delay elements of the fine-adjustment phase difference conversion circuit 1801 and the offset amount of the phase comparator Ci are canceled out each other. After the same offset correction is performed for a phase comparator Ci+1, the phase difference measuring device shown in FIG. 1 is operated. That is, when the delay amount of one delay element in each of the phase comparators Ci and Ci+1 is increased by Ts−Tr, the relationship between the delay amounts is as shown in FIG. 19, and the relationship between a phase difference Tjit between input signals 1805 and 1806, a difference Td between Tr and Ts, and the outputs from the phase comparators Ci and Ci+1 is identical to FIG. 20 (an ideal state). More specifically, the comparison results from the phase comparators Ci and Ci+1 can be measured without being affected by variations Δa and Δb of the delay elements.

Note that the present invention is not limited to the embodiments and practical examples described above, and the embodiments and practical examples can be appropriately changed within the scope of the technical idea of the present invention.

As has been explained above, the phase difference measuring device according to the present invention comprises a plurality of first phase difference measuring circuits formed in a row, and first phase difference conversion circuits each connected between adjacent first phase difference measuring circuits. The first phase difference measuring circuit receives first and second signals, respectively gives the first and second signals first and second delay amounts cumulatively a plurality of number of times, and, whenever giving the delay amounts, compares the phases of the first and second signals given the delay amounts, thereby determining which one of the phases leads the other. The first phase difference conversion circuit receives the first and second signals input to the first phase difference measuring circuit in the preceding stage, respectively gives the first and second signals a first total delay amount as a total of the first delay amounts and a second total delay amount as a total of the second delay amounts given by the first phase difference measuring circuit in the preceding stage, and outputs the first and second signals to the first phase difference measuring circuit in the succeeding stage. While delay amounts are conventionally serially given in one portion, the present invention serially gives delay amounts in a plurality of portions at the same time, thereby shortening the measuring time.

The first phase difference measuring circuit may also comprise a plurality of series-connected delay circuits configured to input the first and second signals, respectively give the first and second signals the first and second delay amounts, and output the first and second signals, and a plurality of phase comparison circuits formed in one-to-one correspondence with the delay circuits, and configured to compare the phases of the first and second signals output from the delay circuit, thereby determining which one of the phases leads the other. Note that "compare the phases of the first and second signals and determine which one of the phases leads the other" has the same meaning as "compare the phases of the first and second signals and determine which one of the phases lags behind the other".

A difference between the first and second delay amounts may also correspond to a resolution. One of the first and second delay amounts may also be zero. The resolution when the difference between the first and second delay amounts is the resolution can be made higher than that when one of the first and second delay amounts is zero. The arrangement when one of the first and second delay amounts is zero can be made simpler than that when neither is zero.

The phase difference measuring device described above may also comprise a plurality of second phase difference measuring circuits formed in a row and second phase difference conversion circuits each connected between adjacent second phase difference measuring circuits. The second phase difference measuring circuit receives the first and second signals, respectively gives the first and second signals third and fourth delay amounts having a magnitude relationship different from that of the first and second delay amounts cumulatively a plurality of number of times, and, whenever giving the delay amounts, compares the phases of the first and second signals given the delay amounts, thereby determining which one of the phases leads the other. The second phase difference conversion circuit receives the first and second signals input to the second phase difference measuring circuit in the preceding stage, respectively gives the first and second signals a total third delay amount as a total of the third delay amounts and a total fourth delay amount as a total of the fourth delay amounts given by the second phase difference measuring circuit in the preceding stage, and outputs the first and second signals to the second phase difference measuring circuit in the succeeding stage. "The third and fourth delay amounts have a magnitude relationship different from that of the first and second delay amounts" means that if the first delay amount is larger than the second delay amount, the third delay amount is smaller than the fourth delay amount, and that if the first delay amount is smaller than the second delay amount, the third delay amount is larger than the fourth delay amount. In this case, if the phase of the first signal sequentially leads that of the second signal in the first phase difference measuring circuit and first phase difference conversion circuit, the phase of the first signal sequentially lags behind that of the second signal in the second phase difference measuring circuit and second phase difference conversion circuit. Accordingly, the measuring range of the signal to be measured continuously widens. Note that the first phase difference measuring circuit in the initial stage and the second phase difference measuring circuit in the initial stage may also receive the first and second signals in common.

The first and third delay amounts may also be equal, and the first delay amount may also be used instead of the third delay amount. In this case, the overall configuration can be simplified because the arrangement pertaining to the third delay amount can be omitted.

The absolute value of the difference between the first and second delay amounts may also be equal to that of the difference between the third and fourth delay amounts. In this case, the measuring range of the signal to be measured continuously widens at equal intervals.

The phase difference measuring device described above may also further comprise a selection circuit connected between the first phase difference measuring circuit and the first phase difference conversion circuit in the preceding stage, and configured to selectively input, to the first phase difference measuring circuit, the first and second signals output from the first phase difference conversion circuit in the preceding stage or the first and second signals input to any first phase difference measuring circuit except for the first phase difference measuring circuit. Since a certain phase difference measuring circuit receives the first and second signals input to another phase difference measuring circuit, a plurality of phase difference measuring circuits can measure the phase difference between the first and second signals in parallel within the same measuring range. This increases the measurement accuracy.

The delay circuit may also comprise a state switching circuit configured to switch a first state in which the first and second delay amounts have different values, and a second state in which the first and second delay amounts have the same value, and the phase comparison circuit may also comprise an offset adjusting means for adjusting the offset of sensitivity such that when identical signals are input as the first and second signals to the delay circuit in the second state and the phases of the first and second signals output from the delay circuit are compared, the probability at which the phase of the first signal is found to lead that of the second signal is equal to the probability at which the phase of the second signal is found to lead that of the first signal. This makes it possible to perform offset correction requiring neither a special input signal nor special data processing.

The phase comparison circuit may also start the operation of comparing the phases of the input first and second signals and determining which one of the phases leads the other, after one of the first and second signals is activated. This obviates the need for any external signal for starting the operation of the phase comparator.

The phase difference measuring device described above may also comprise an integrated circuit formed on a semiconductor substrate. This is a general form of the phase difference measuring device according to the present invention.

A phase comparison circuit adjusting method according to the present invention is a method of adjusting the phase comparison circuit of the phase difference measuring apparatus described above, and comprises steps of setting the same value as the first and second delay amounts to be given to the first and second signals by the delay circuit, and adjusting the offset of the sensitivity of the phase comparison circuit such that when identical signals are input as the first and second signals to the delay circuit and the phases of the first and second signals output from the delay circuit are compared by the phase comparison circuit, the probability at which the phase of the first signal is found to lead that of the second signal is equal to the probability at which the phase of the second signal is found to lead that of the first signal. This makes it possible to perform offset correction requiring neither a special input signal nor special data processing.

The present invention may also be configured as follows. In the following explanation, the present invention is an integrated circuit formed on a semiconductor substrate.

A first integrated circuit is a measuring circuit for measuring the phase difference between two signals, and has a structure in which two input signals S0 and R0 are input to a first phase difference measuring circuit capable of measurements from 0 to (a1−1)×T (a1 is an integer) at a resolution T, and also input to a first phase difference conversion circuit that changes the phase difference between two signals by a1×T, thereby outputting two output signals S1 and R1, S1 and R1 are input to a second measuring circuit capable of measurements from a1×T to (a1+a2−1)×T (a2 is an integer) at the resolution T, and also input to a second phase difference conversion circuit that changes the phase difference between two signals by a2×T, thereby outputting two output signals S2 and R2, and n stages (n exceeds a phase difference measuring range requiring (a1+a2+ . . . +an)×T) of these circuits are connected.

A second integrated circuit has a structure in which in the first integrated circuit, the phase difference measuring circuit capable of measurements from 0 to (a−1)×T outputs a pairs of signals by changing a phase difference Tjit between two input signals for every T from Tjit to Tjit+(a−1)×T by using a fine-adjustment phase difference conversion circuit comprising a phase difference conversion circuit that changes the phase difference between two signals by m×T (m is an integer), and compares the phase difference by a phase comparator.

A third integrated circuit has a structure in which in the first or second integrated circuit, the (k−1)th input or the input signal to be measured can be selectively input to the kth phase difference conversion circuit (k is an integer from 2 to n).

A fourth integrated circuit has a structure in which in any of the first to third integrated circuits, the fine-adjustment phase difference measuring circuit comprises a −1 or more phase difference conversion circuits that change the phase difference between two signals by T, and outputs a pairs of signals by further changing the phase difference Tjit of two input signals for every T from Tjit to Tjit+(a−1)×T.

A fifth integrated circuit has a structure in which in any of the first to fourth integrated circuits, the phase difference conversion circuit inputs a first input signal to a delay element having a delay time of Tr (Tr is a positive number of 0 or more), and a second input signal to a delay element having a delay time of Tr+a×T (a is a positive number of 0 or more), thereby changing the phase difference between output signals by a×T from that of the two input signals.

A sixth integrated circuit has a structure in which in any of the first to fourth integrated circuits, the phase comparator is given an offset-adjustable configuration, thereby reducing the offset generated by the phase difference measuring circuit and phase comparator.

A seventh integrated circuit has a structure in which in any of the first to sixth integrated circuits, in the state in which identical signals are input as two signals to the fine-adjustment phase difference measuring circuit and the delay elements in the phase difference conversion circuit are set to have the same delay time, the offset reducing means first operates the first phase comparator to adjust the offset of the first phase comparator so that the probability at which the level of the output signal goes high is equal to the probability at which the level of the output signal goes low, then operates the second phase comparator to adjust the offset of the second phase comparator so that the probability at which the level of the output signal goes high is equal to the probability at which the level of the output signal goes low, and performs this offset adjustment for all the phase comparators.

An eighth integrated circuit has a structure in which in any of the first to seventh integrated circuits, the offset-adjustable phase comparator comprises a precharge logic and can operate without using any external sync signal because the phase comparator can determine a phase comparison state and precharge state in accordance with the states of two input signals, i.e., the phase comparator generates a precharge signal when both the first and second input signals are inactive, and becomes active when the first or second input signal becomes active.

The invention claimed is:

1. A phase difference measuring device characterized by comprising:
    a plurality of first phase difference measuring circuits formed in a row; and
    first phase difference conversion circuits each connected between adjacent first phase difference measuring circuits,
    wherein said first phase difference measuring circuit receives a first signal and a second signal, respectively gives the first signal and the second signal a first delay amount and a second delay amount cumulatively a plurality of number of times, and, whenever giving the delay amounts, compares phases of the first signal and the second signal given the delay amounts, thereby determining which one of the phases leads the other, and
    said first phase difference conversion circuit receives the first signal and the second signal input to said first phase difference measuring circuit in a preceding stage, respectively gives the first signal and the second signal a first total delay amount as a total of the first delay amounts and a second total delay amount as a total of the second delay amounts given by said first phase difference measuring circuit in the preceding stage, and outputs the first signal and the second signal to said first phase difference measuring circuit in a succeeding stage.

2. A phase difference measuring device according to claim 1, characterized in that said first phase difference measuring circuit comprises:
    a plurality of series-connected delay circuits configured to receive the first signal and the second signal, respectively give the first signal and the second signal the first delay amount and the second delay amount, and output the first signal and the second signal; and
    a plurality of phase comparison circuits formed in one-to-one correspondence with said delay circuits, and configured to compare the phases of the first signal and the second signal output from said delay circuit, thereby determining which one of the phases leads the other.

3. A phase difference measuring device according to claim 2, characterized in that
    said delay circuit comprises a state switching circuit configured to switch a first state in which the first delay amount and the second delay amount have different values, and a second state in which the first delay amount and the second delay amount have the same value, and
    said phase comparison circuit comprises offset adjusting means for adjusting offset of sensitivity such that when identical signals are input as the first signal and the second signal to said delay circuit in the second state and the phases of the first signal and the second signal output from said delay circuit are compared, a probability at which the phase of the first signal is found to lead that of the second signal is equal to a probability at which the phase of the second signal is found to lead that of the first signal.

4. A phase difference measuring device according to claim 2, characterized in that said phase comparison circuit starts the operation of comparing the phases of the input first signal and the input second signal and determining which one of the phases leads the other, after one of the first signal and the second signal is activated.

5. A phase difference measuring device according to claim 1, characterized in that a difference between the first delay amount and the second delay amount corresponds to a resolution.

6. A phase difference measuring device according to claim 1, characterized in that one of the first delay amount and the second delay amount is zero.

7. A phase difference measuring device according to claim 1, characterized by further comprising:
    a plurality of second phase difference measuring circuits formed in a row; and
    second phase difference conversion circuits each connected between adjacent second phase difference measuring circuits,
    wherein said second phase difference measuring circuit receives the first signal and the second signal, respectively gives the first signal and the second signal a third delay amount and a fourth delay amount having a magnitude relationship different from that of the first delay amount and the second delay amount cumulatively a plurality of number of times, and, whenever giving the delay amounts, compares the phases of the first signal and the second signal given the delay amounts, thereby determining which one of the phases leads the other, and
    said second phase difference conversion circuit receives the first signal and the second signal input to said second phase difference measuring circuit in a preceding stage, respectively gives the first signal and the second signal a total third delay amount as a total of the third delay amounts and a total fourth delay amount as a total of the fourth delay amounts given by said second phase difference measuring circuit in the preceding stage, and outputs the first signal and the second signal to said second phase difference measuring circuit in a succeeding stage.

8. A phase difference measuring device according to claim 7, characterized in that said first phase difference measuring circuit in an initial stage and said second phase difference measuring circuit in an initial stage receive the first signal and the second signal in common.

9. A phase difference measuring device according to claim 7, characterized in that the first delay amount and the third delay amount are equal, and the first delay amount is used instead of the third delay amount.

10. A phase difference measuring device according to claim 7, characterized in that an absolute value of a difference between the first delay amount and the second delay amount is equal to that of a difference between the third delay amount and the fourth delay amount.

11. A phase difference measuring device according to claim 1, characterized by further comprising a selection circuit connected between said first phase difference measuring circuit and said first phase difference conversion circuit in a preceding stage, and configured to selectively input, to said first phase difference measuring circuit, one of a pair of the first signal and the second signal output from said first phase difference conversion circuit in the preceding stage and a pair of the first signal and the second signal input to any first phase difference measuring circuit except for said first phase difference measuring circuit.

12. A phase difference measuring device according to claim 1, characterized in that the device comprises an integrated circuit formed on a semiconductor substrate.

13. A phase comparison circuit adjusting method for a phase comparison circuit in a phase difference measuring device including a plurality of phase difference measuring circuits formed in a row, and phase difference conversion circuits each connected between adjacent phase difference measuring circuits, wherein the phase difference measuring circuit includes a plurality of series-connected delay circuits configured to receive a first signal and a second signal, respectively give the first signal and the second signal a first delay amount and a second delay amount, and output the first signal and the second signal, and a plurality of phase comparison circuits formed in one-to-one correspondence with the delay circuits, and configured to compare phases of the first signal and the second signal output from the delay circuit, thereby determining which one of the phases leads the other, and the phase difference conversion circuit receives the first signal and the second signal input to the phase difference measuring circuit in a preceding stage, respectively gives the first signal and the second signal a first total delay amount as a total of the first delay amounts and a second total delay amount as a total of the second delay amounts given by the phase difference measuring circuit in the preceding stage, and outputs the first signal and the second signal to the phase difference measuring circuit in a succeeding stage, characterized by comprising the steps of:

setting the same value as the first delay amount and the second delay amount to be respectively given to the first signal and the second signal by the delay circuit; and adjusting offset of sensitivity of the phase comparison circuit such that when identical signals are input as the first signal and the second signal to the delay circuit and the phases of the first signal and the second signal output from the delay circuit are compared by the phase comparison circuit, a probability at which the phase of the first signal is found to lead that of the second signal is equal to a probability at which the phase of the second signal is found to lead that of the first signal.

* * * * *